US012665161B2

(12) United States Patent
Kimizuka et al.

(10) Patent No.: US 12,665,161 B2
(45) Date of Patent: Jun. 23, 2026

(54) CHARGED PARTICLE BEAM SYSTEM

(71) Applicant: Hitachi High-Tech Corporation, Tokyo (JP)

(72) Inventors: Heita Kimizuka, Tokyo (JP); Natsuki Tsuno, Tokyo (JP); Yasuhiro Shirasaki, Tokyo (JP); Minami Uchiho, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 465 days.

(21) Appl. No.: 18/283,499

(22) PCT Filed: Mar. 26, 2021

(86) PCT No.: PCT/JP2021/012996
§ 371 (c)(1),
(2) Date: Sep. 22, 2023

(87) PCT Pub. No.: WO2022/201522
PCT Pub. Date: Sep. 29, 2022

(65) Prior Publication Data
US 2024/0177964 A1 May 30, 2024

(51) Int. Cl.
*H01J 37/22* (2006.01)
*H01J 37/244* (2006.01)
*H01J 37/28* (2006.01)

(52) U.S. Cl.
CPC .......... *H01J 37/228* (2013.01); *H01J 37/222* (2013.01); *H01J 37/244* (2013.01); *H01J 37/28* (2013.01);
(Continued)

(58) Field of Classification Search
CPC .. H01J 37/00; H01J 37/02; H01J 37/22; H01J 37/222; H01J 37/228; H01J 37/244;
(Continued)

(56) References Cited

U.S. PATENT DOCUMENTS 8,440,970 B2     5/2013   Zewail
2022/0059317 A1   2/2022   Shouji et al.
(Continued)

FOREIGN PATENT DOCUMENTS

WO      WO 2020/053967 A1     3/2020

OTHER PUBLICATIONS

International Search Report (PCT/ISA/210) issued in PCT Application No. PCT/JP2021/012996 dated May 25, 2021 with English translation (4 pages).
(Continued)

*Primary Examiner* — Jason L McCormack
(74) *Attorney, Agent, or Firm* — Crowell & Moring LLP

(57) ABSTRACT

An object of the present disclosure is to provide a charged particle beam system capable of obtaining information about a sample by using a feature amount on an observed image caused by light interference, light diffraction, light standing waves, and the like caused by irradiating a sample with light, and the like. In the charged particle beam system according to the present disclosure, a first feature amount resulting from the light interference, the light diffraction, or the light standing wave generated by irradiating the sample with light is extracted from the observed image of the sample, and a second feature amount of the sample is obtained by using the first feature amount (see FIG. 6).

19 Claims, 36 Drawing Sheets

(52) U.S. Cl.
CPC ................. $H01J\ 2237/2448$ (2013.01); $H01J$
$2237/2809$ (2013.01)

(58) Field of Classification Search
CPC ...... H01J 37/28; H01J 37/26; H01J 2237/226;
H01J 2237/2448; H01J 2237/24578; H01J
2237/2614; H01J 2237/2809
USPC ................................ 250/306, 307, 310, 311
See application file for complete search history.

(56) References Cited

U.S. PATENT DOCUMENTS

| | | | | |
|---|---|---|---|---|
| 2022/0139667 A1* | 5/2022 | Shouji | ................... | H01J 37/226 |
| 2022/0299861 A1* | 9/2022 | Nanao | ................. | G03F 7/70641 |
| 2023/0369012 A1* | 11/2023 | Takeda | ................. | H01J 37/244 |

OTHER PUBLICATIONS

Japanese-language Written Opinion (PCT/ISA/237) issued in PCT Application No. PCT/JP2021/012996 dated May 25, 2021 with English translation (5 pages).

* cited by examiner

Fig. 7

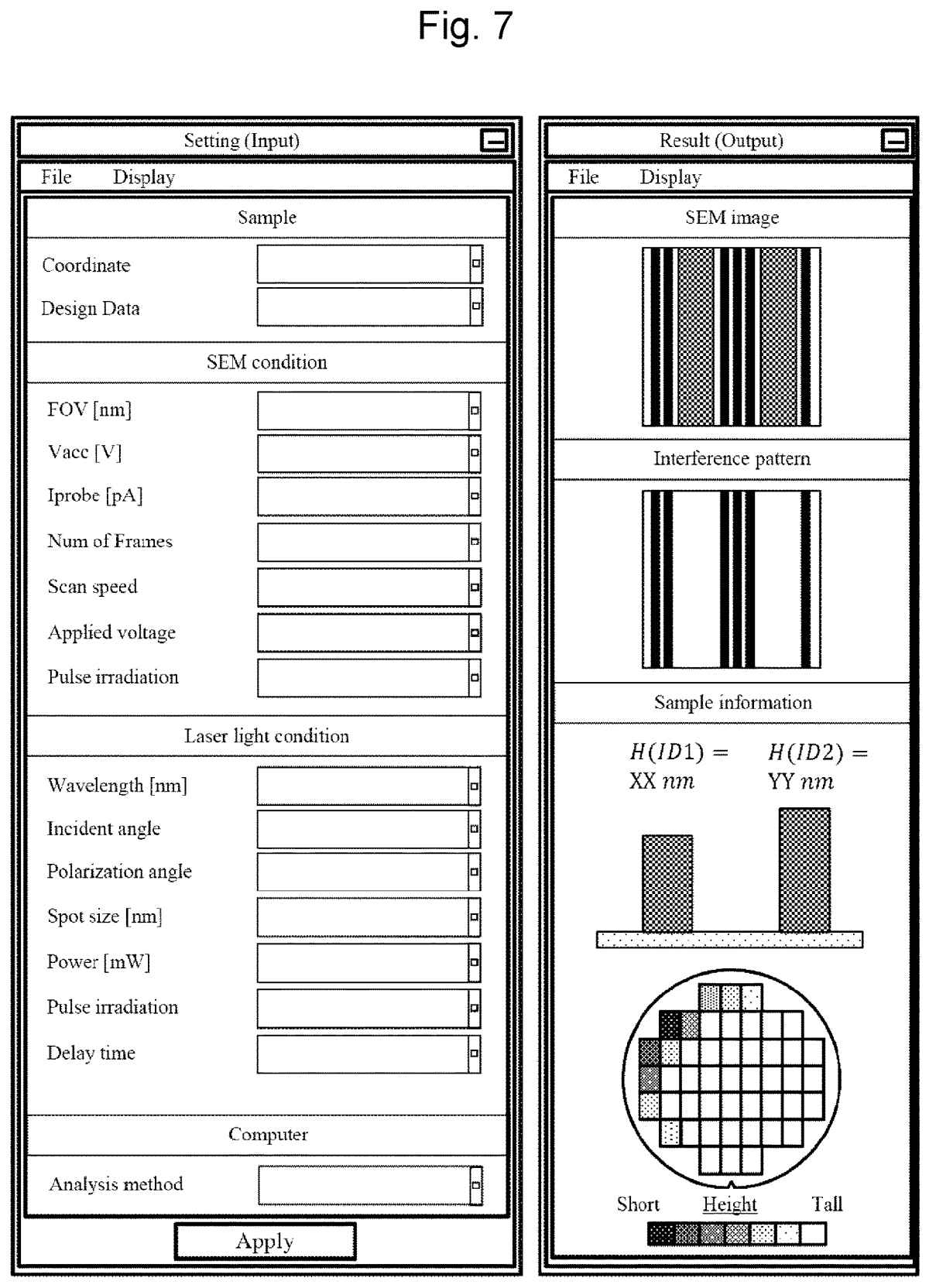

Setting (Input)    ⊟

File    Display

Sample

| | |
|---|---|
| Coordinate | |
| Design Data | |

SEM condition

| | |
|---|---|
| FOV [nm] | |
| Vacc [V] | |
| Iprobe [pA] | |
| Num of Frames | |
| Scan speed | |
| Applied voltage | |
| Pulse irradiation | |

Laser light condition

| | |
|---|---|
| Wavelength [nm] | |
| Incident angle | |
| Polarization angle | |
| Spot size [nm] | |
| Power [mW] | |
| Pulse irradiation | |
| Delay time | |

Computer

| | |
|---|---|
| Analysis method | |

Apply

---

Result (Output)    ⊟

File    Display

SEM image

Interference pattern

Sample information $H(ID1) = $ XX $nm$        $H(ID2) = $ YY $nm$

Short    <u>Height</u>    Tall

Fig. 11

Fig. 13
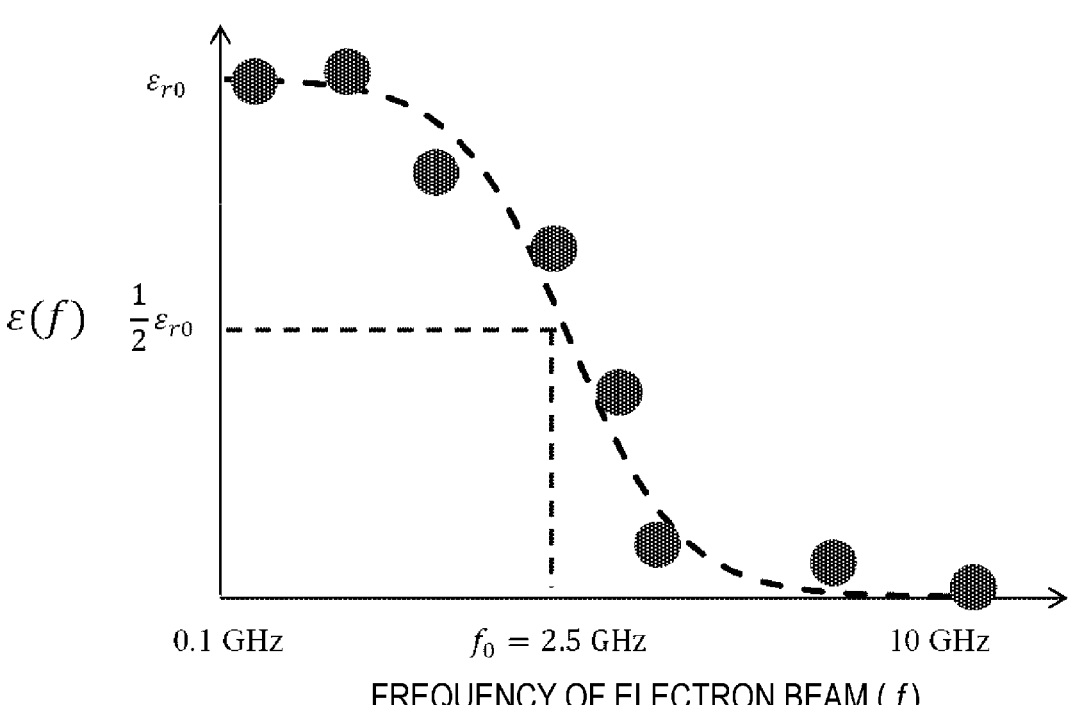
FREQUENCY OF ELECTRON BEAM ( $f$ )
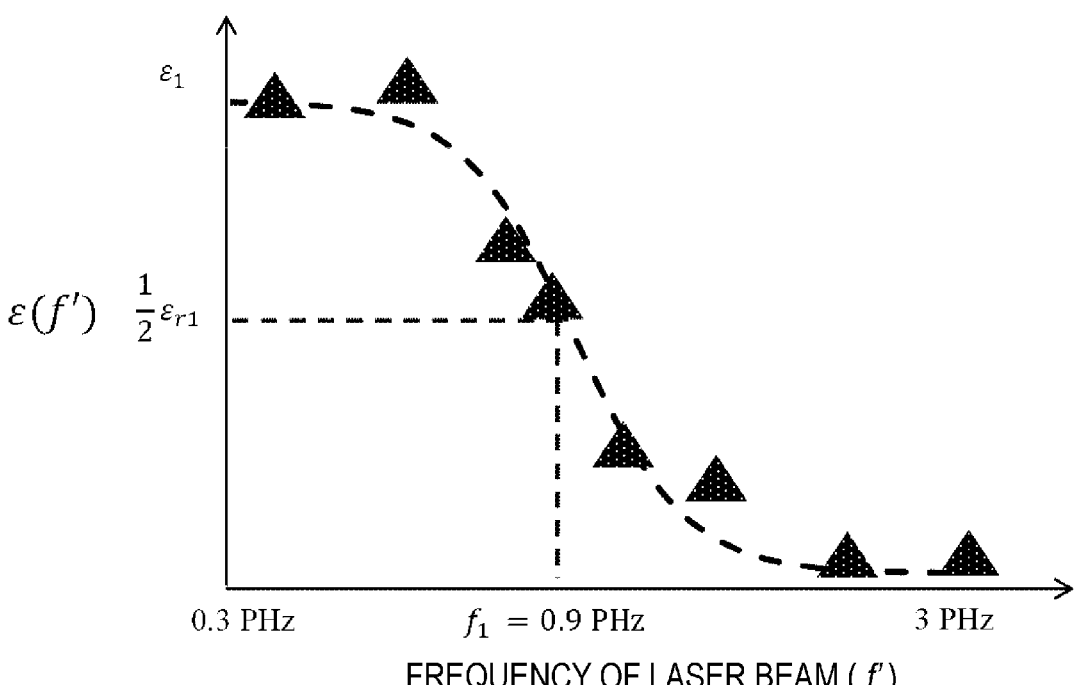
FREQUENCY OF LASER BEAM ( $f'$ )

POSITION OF INTERFERENCE FRINGE $$L_1 = f(\theta, \lambda, \varepsilon_r, \mu_r, \varphi, \alpha)$$

INTERVAL OF INTERFERENCE FRINGE $$\Delta L = f(\theta, \lambda, \varepsilon_r, \mu_r, \alpha)$$

PHASE OF WAVE $$I = e^{-kx}$$

INTENSITY OF INTERFERENCE FRINGE

Fig. 16

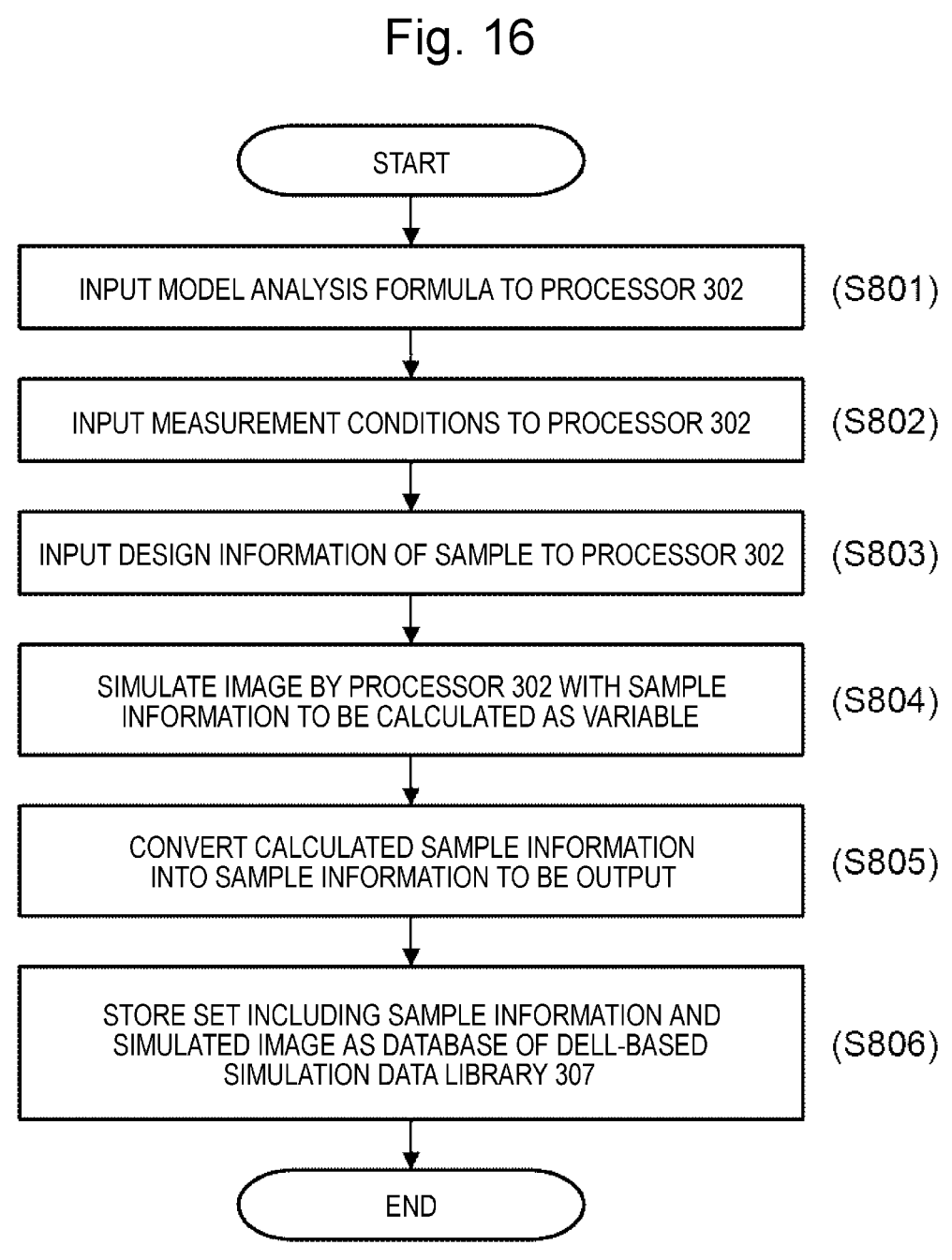

START

INPUT MODEL ANALYSIS FORMULA TO PROCESSOR 302     (S801)

INPUT MEASUREMENT CONDITIONS TO PROCESSOR 302     (S802)

INPUT DESIGN INFORMATION OF SAMPLE TO PROCESSOR 302     (S803)

SIMULATE IMAGE BY PROCESSOR 302 WITH SAMPLE
INFORMATION TO BE CALCULATED AS VARIABLE     (S804)

CONVERT CALCULATED SAMPLE INFORMATION
INTO SAMPLE INFORMATION TO BE OUTPUT     (S805)

STORE SET INCLUDING SAMPLE INFORMATION AND
SIMULATED IMAGE AS DATABASE OF DELL-BASED
SIMULATION DATA LIBRARY 307     (S806)

END

START

INPUT INFORMATION ON DEPTH,
POSITION, AND SIZE OF DEFECT
TO FOCUSED ION BEAM DEVICE     (S5101)

PROCESS SAMPLE WITH
FOCUSED ION BEAM BASED ON
INFORMATION ON DEPTH,
POSITION, AND SIZE OF DEFECT     (S5102)

END

PASSIVATION FILM (TiOx)

Si SUBSTRATE

DIFFUSION RATE

Low                         High

Fig. 36

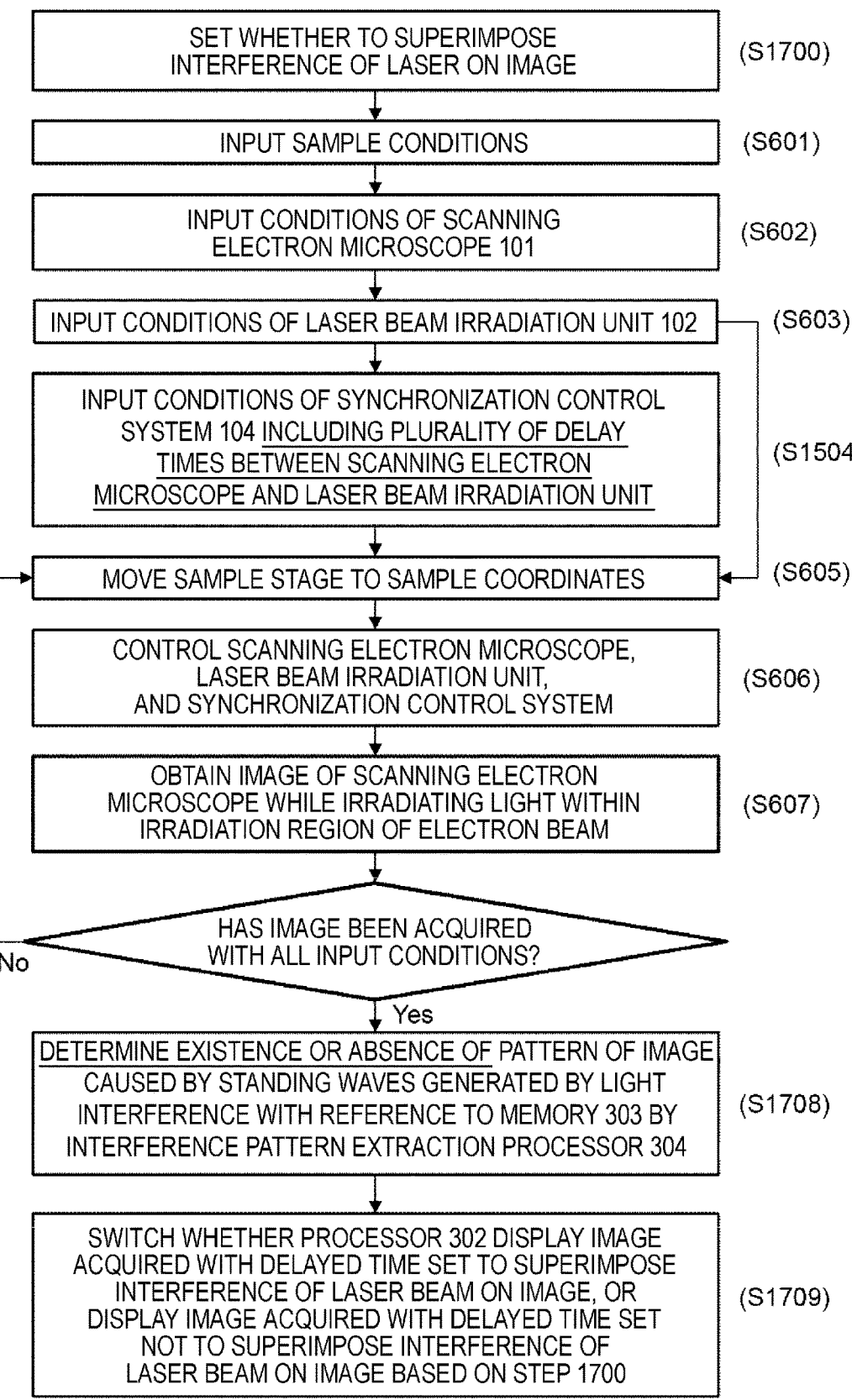

SET WHETHER TO SUPERIMPOSE INTERFERENCE OF LASER ON IMAGE (S1700)

INPUT SAMPLE CONDITIONS (S601)

INPUT CONDITIONS OF SCANNING ELECTRON MICROSCOPE 101 (S602)

INPUT CONDITIONS OF LASER BEAM IRRADIATION UNIT 102 (S603)

INPUT CONDITIONS OF SYNCHRONIZATION CONTROL SYSTEM 104 INCLUDING PLURALITY OF DELAY TIMES BETWEEN SCANNING ELECTRON MICROSCOPE AND LASER BEAM IRRADIATION UNIT (S1504)

MOVE SAMPLE STAGE TO SAMPLE COORDINATES (S605)

CONTROL SCANNING ELECTRON MICROSCOPE, LASER BEAM IRRADIATION UNIT, AND SYNCHRONIZATION CONTROL SYSTEM (S606)

OBTAIN IMAGE OF SCANNING ELECTRON MICROSCOPE WHILE IRRADIATING LIGHT WITHIN IRRADIATION REGION OF ELECTRON BEAM (S607)

HAS IMAGE BEEN ACQUIRED WITH ALL INPUT CONDITIONS?

No

Yes

DETERMINE EXISTENCE OR ABSENCE OF PATTERN OF IMAGE CAUSED BY STANDING WAVES GENERATED BY LIGHT INTERFERENCE WITH REFERENCE TO MEMORY 303 BY INTERFERENCE PATTERN EXTRACTION PROCESSOR 304 (S1708)

SWITCH WHETHER PROCESSOR 302 DISPLAY IMAGE ACQUIRED WITH DELAYED TIME SET TO SUPERIMPOSE INTERFERENCE OF LASER BEAM ON IMAGE, OR DISPLAY IMAGE ACQUIRED WITH DELAYED TIME SET NOT TO SUPERIMPOSE INTERFERENCE OF LASER BEAM ON IMAGE BASED ON STEP 1700 (S1709)

Fig. 38

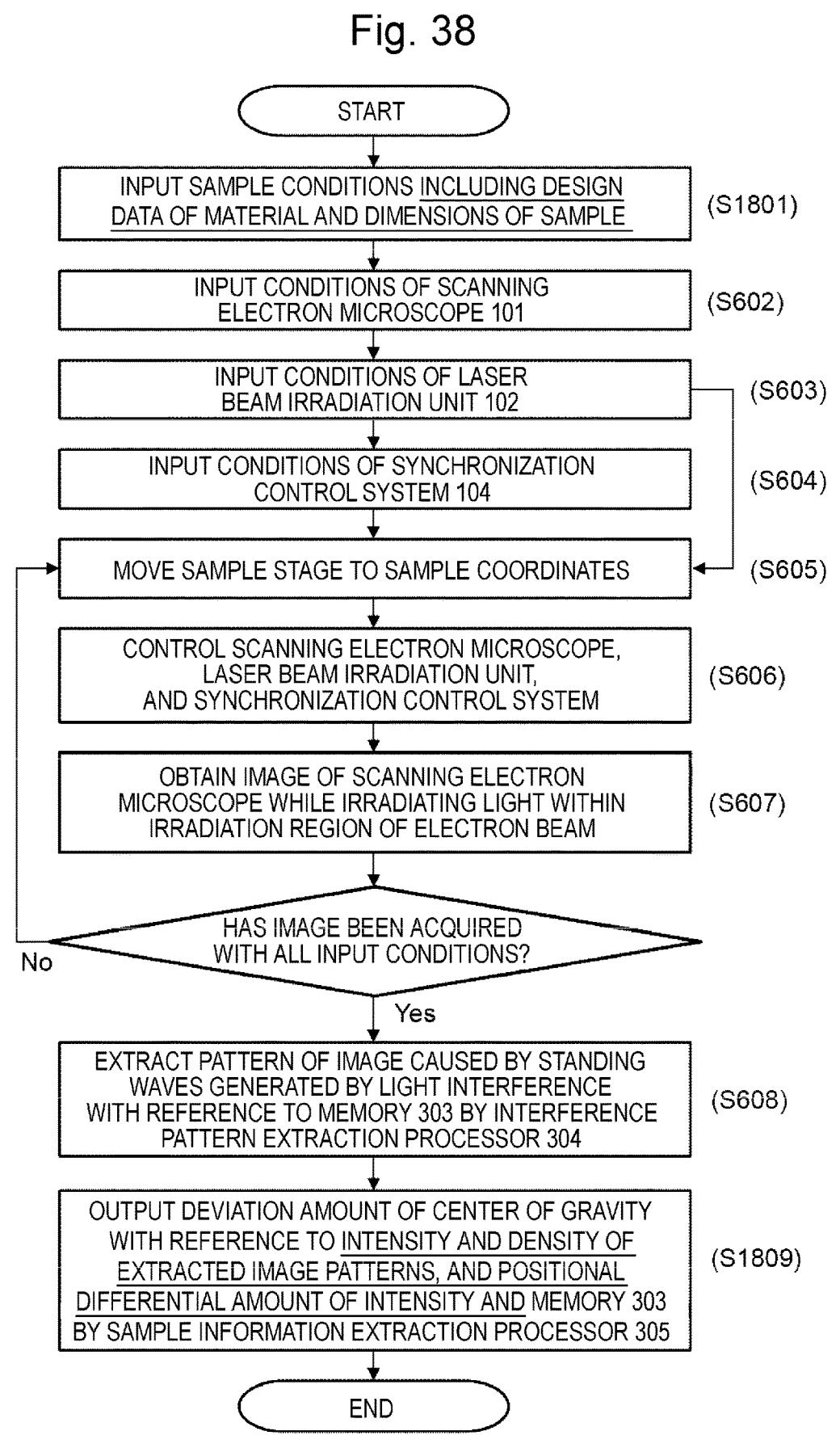

START

INPUT SAMPLE CONDITIONS INCLUDING DESIGN
DATA OF MATERIAL AND DIMENSIONS OF SAMPLE    (S1801)

INPUT CONDITIONS OF SCANNING
ELECTRON MICROSCOPE 101    (S602)

INPUT CONDITIONS OF LASER
BEAM IRRADIATION UNIT 102    (S603)

INPUT CONDITIONS OF SYNCHRONIZATION
CONTROL SYSTEM 104    (S604)

MOVE SAMPLE STAGE TO SAMPLE COORDINATES    (S605)

CONTROL SCANNING ELECTRON MICROSCOPE,
LASER BEAM IRRADIATION UNIT,
AND SYNCHRONIZATION CONTROL SYSTEM    (S606)

OBTAIN IMAGE OF SCANNING ELECTRON
MICROSCOPE WHILE IRRADIATING LIGHT WITHIN
IRRADIATION REGION OF ELECTRON BEAM    (S607)

HAS IMAGE BEEN ACQUIRED
WITH ALL INPUT CONDITIONS?

No

Yes

EXTRACT PATTERN OF IMAGE CAUSED BY STANDING
WAVES GENERATED BY LIGHT INTERFERENCE
WITH REFERENCE TO MEMORY 303 BY INTERFERENCE
PATTERN EXTRACTION PROCESSOR 304    (S608)

OUTPUT DEVIATION AMOUNT OF CENTER OF GRAVITY
WITH REFERENCE TO INTENSITY AND DENSITY OF
EXTRACTED IMAGE PATTERNS, AND POSITIONAL
DIFFERENTIAL AMOUNT OF INTENSITY AND MEMORY 303
BY SAMPLE INFORMATION EXTRACTION PROCESSOR 305    (S1809)

END

Fig. 39
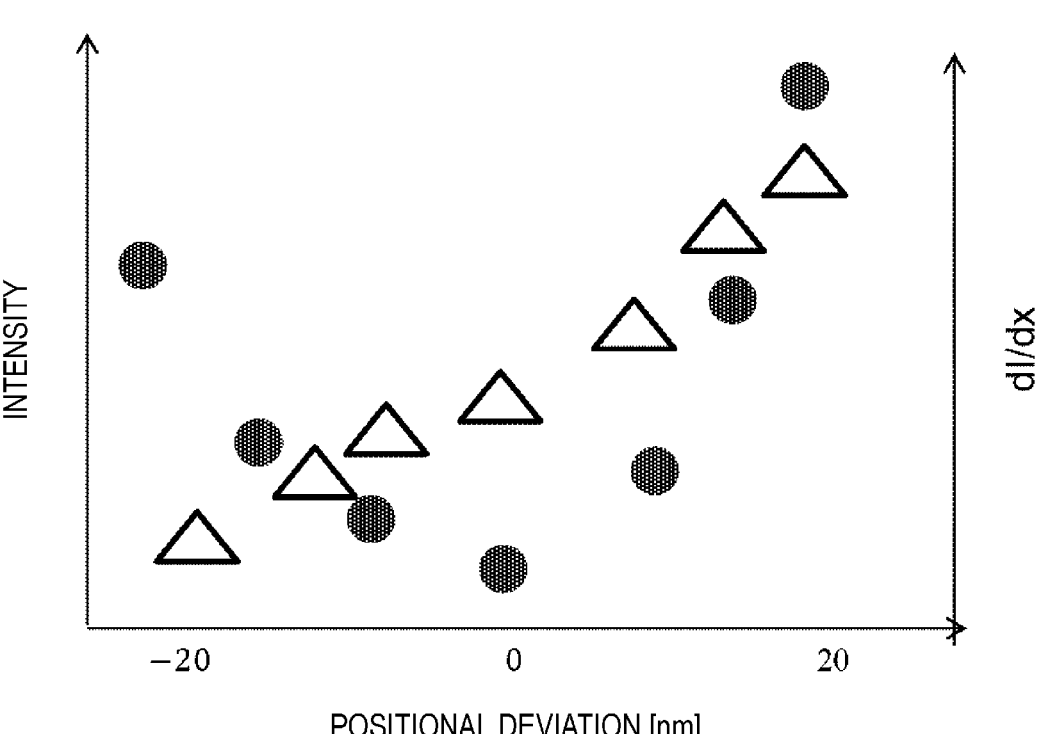
POSITIONAL DEVIATION [nm]
  INTENSITY
dI/dx

CHARGED PARTICLE BEAM SYSTEM

TECHNICAL FIELD

The present disclosure relates to a charged particle beam system.

BACKGROUND ART

In an electron microscope, an electron beam is focused by an electron lens to irradiate a sample, and secondary electrons generated from the sample are detected to form an image. When observing a sample using an electron microscope, the effect of light on the sample can be superimposed on the electron microscope image by irradiating light onto the irradiated region of the electron beam.

PTL 1 discloses an electron microscope that superimposes an image of carrier traps on crystal defect interfaces caused by irradiating SiC with light. PTL 2 discloses an electron microscope in which nanoscale mechanical vibrations generated by irradiating a graphite film with light are superimposed on an image.

CITATION LIST

Patent Literature

PTL 1: WO2020/053967A1
PTL 2: U.S. Pat. No. 8,440,970B2

SUMMARY OF INVENTION

Technical Problem

The electron microscopes disclosed in PTL 1 and 2 are not systems that take into account the intensity distribution of standing waves generated by light interference, and thus, sample information that can be determined from the conditions under which interference occurs is not superimposed on the image. Therefore, as sample information that can be determined from the conditions under which interference occurs, for example, sample shape, dimensions, height, sidewall angle, dielectric constant, dielectric constant, magnetic permeability, light absorption rate, side curvature, bowing, necking, defects, voids, material information, diffusion rate, mobility, and the like cannot be obtained.

The present disclosure has been made in view of the above problems, and an object of the present disclosure is to provide a charged particle beam system capable of obtaining information about a sample by using a feature amount on an observed image caused by light interference, light diffraction, light standing waves, and the like caused by irradiating a sample with light.

Solution to Problem

In the charged particle beam system according to the present disclosure, a first feature amount resulting from the light interference, the light diffraction, or the light standing wave generated by irradiating the sample with light is extracted from the observed image of the sample, and a second feature amount of the sample is obtained by using the first feature amount.

Advantageous Effects of Invention

According to the charged particle beam system according to the present disclosure, information about the sample can be obtained by using the feature amount on the observed image caused by light interference, light diffraction, light standing wave, and the like generated by irradiating the sample with light.

BRIEF DESCRIPTION OF DRAWINGS

FIG. 7 is a diagram showing an example of a user interface provided by the computer system 103.

FIG. 11 is a diagram showing an example of a sample and laser beam.

FIG. 13 is the result of fitting data on the relationship between information on the dielectric constant of a sample and the frequency of pulsed electrons or laser beam.

FIG. 16 is a flowchart illustrating a procedure for generating a database for a simulation data library 307.

FIG. 36 is a flowchart showing a process of switching whether or not the charged particle beam system 100 superimposes interference of laser beam on an image.

FIG. 38 is a flowchart showing a process of acquiring information on a sample by the charged particle beam system 100.

FIG. 39 is an example of data illustrating the relationship between the amount of deviation of the center of gravity and the intensity of an extracted image pattern, and the relationship between the amount of deviation of the center of gravity and the amount of positional differential of the intensity of the extracted image pattern.

DESCRIPTION OF EMBODIMENTS

Embodiment 1

Embodiment 1 of the present disclosure describes a charged particle beam system that acquires information on the height or sidewall angle of the sample from the image pattern resulting from the standing wave generated by the interference between the laser beam incident on the sample and the laser beam reflected from the sample.

Figure 1:
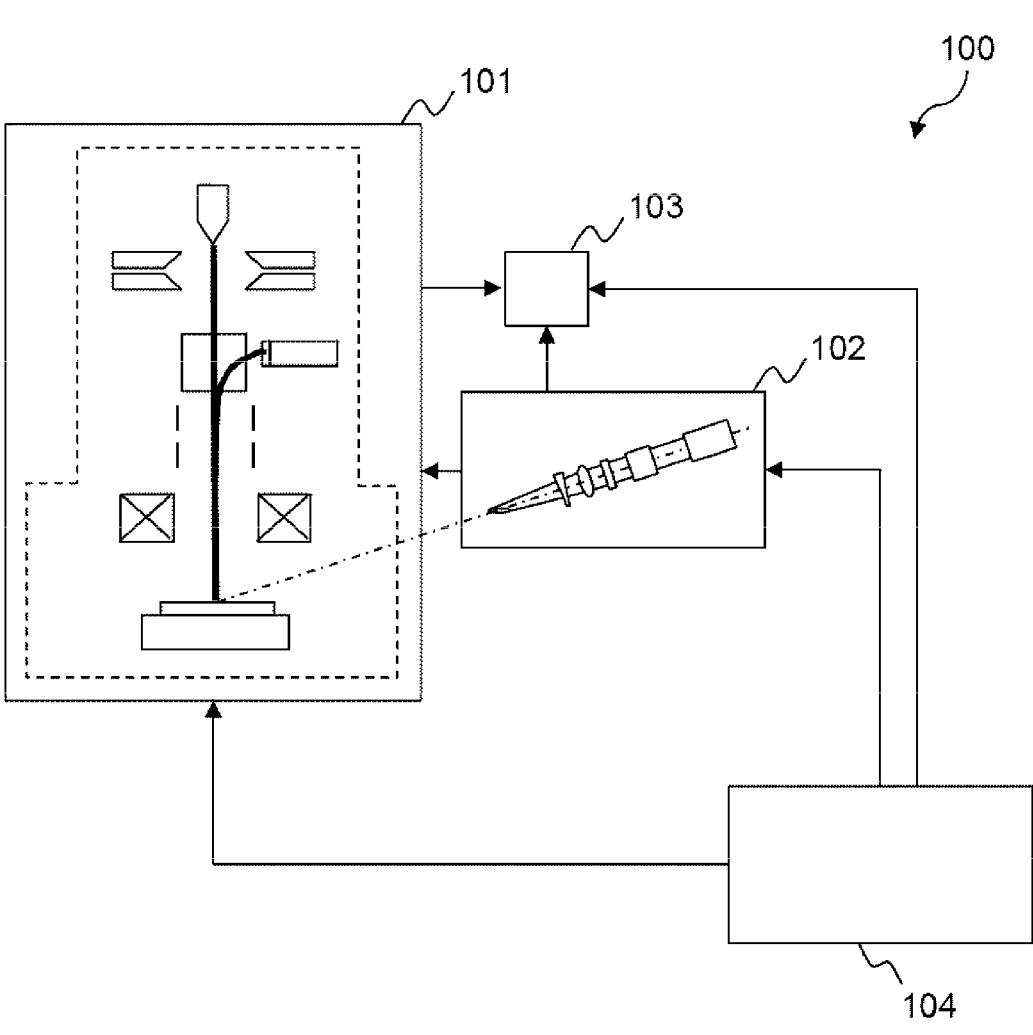
FIG. 1 is a diagram showing a configuration example of a charged particle beam system 100 according to Embodiment 1.

FIG. 1 is a diagram showing a configuration example of a charged particle beam system 100 according to Embodiment 1. The charged particle beam system 100 includes a scanning electron microscope 101, a laser beam irradiation unit 102, a computer system 103, and a synchronization control system 104, which are connected to each other or configured to communicate with each other. The scanning electron microscope 101 and the laser beam irradiation unit 102 are configured to be able to irradiate the same sample with an electron beam and laser beam, respectively, and are configured to irradiate the electron beam within the laser beam irradiation region.

Figure 2:
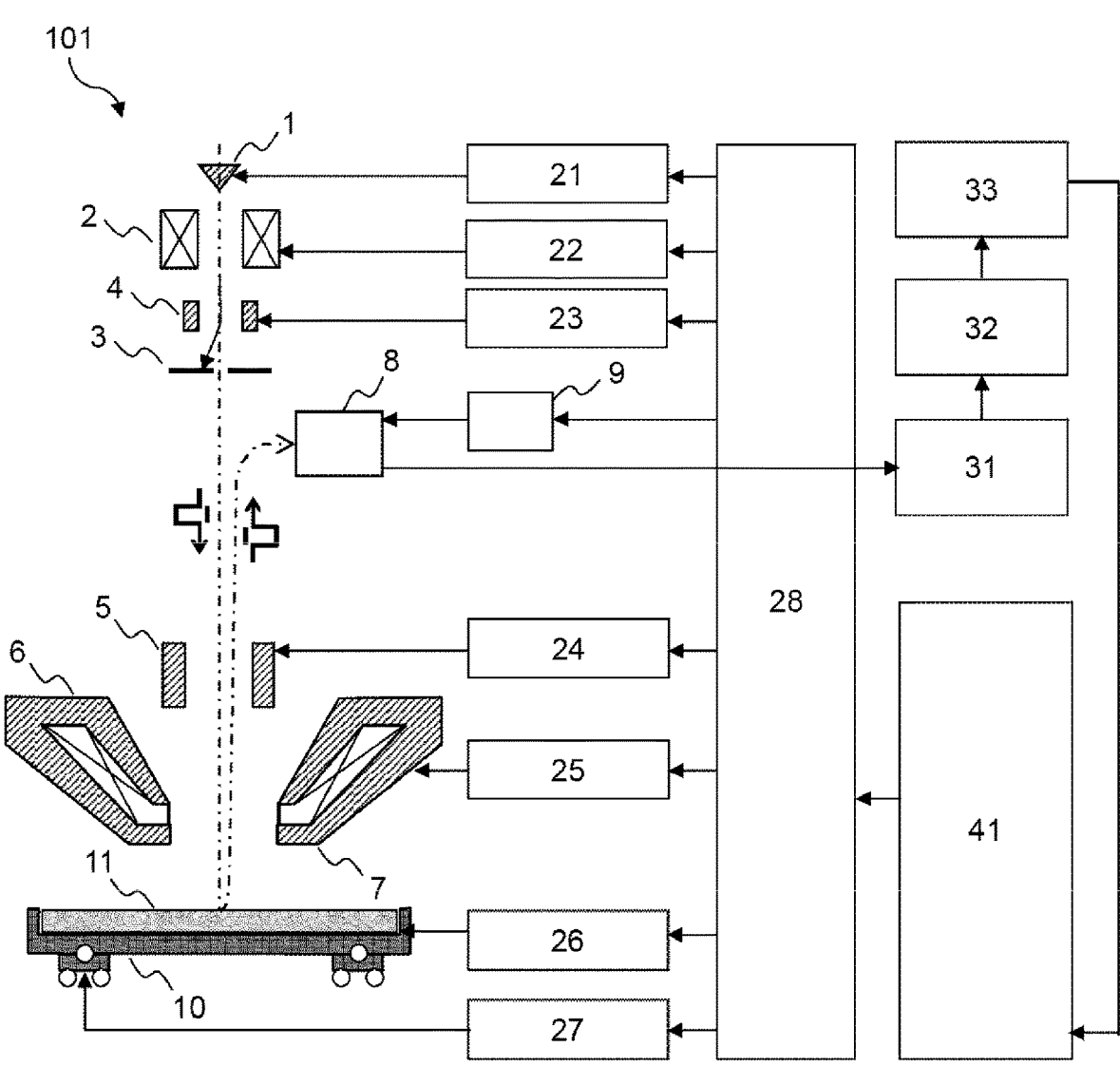
FIG. 2 is a diagram showing a configuration example of a scanning electron microscope 101.

FIG. 2 is a diagram showing a configuration example of the scanning electron microscope 101. The scanning electron microscope 101 is composed of an intermittent irradiation system, an electron optical system, a secondary electron detection system, a stage mechanism system, an image processing system, a control system, and an operation system. The intermittent irradiation system is composed of an electron beam source 1 (charged particle source) and a pulsed electron generator 4.

The electron optical system is composed of a condenser lens 2, a diaphragm 3, a deflector 5, an objective lens 6, and a sample electric field controller 7. The deflector 5 is provided for one-dimensionally or two-dimensionally scanning the electron beam on the sample, and is subject to control described later.

The secondary electron detection system is composed of a detector 8 and an output adjustment circuit 9. The stage mechanism system is composed of a sample stage 10 and a sample 11. The control system is composed of an acceleration voltage control unit 21, an irradiation current control unit 22, a pulse irradiation control unit 23, a deflection control unit 24, a focusing control unit 25, a sample electric field control unit 26, a stage position control unit 27, and a control transmission unit 28. Based on the input information input from an operation interface 41, the control transmission unit 28 writes a control value to each control unit and controls them.

The pulse irradiation control unit 23 controls the irradiation time, which is the time to continuously irradiate the electron beam, the irradiation distance, which is the distance to continuously irradiate the electron beam, or the cutoff time, which is the time between irradiations of the electron beam, or the distance between irradiation points, which is the distance between irradiations of the electron beam. The deflection control unit 24 controls the scanning distance and speed.

The image processing system is composed of a detection signal processing unit 31, a detection signal analysis unit 32, and an image display unit 33. The detection signal processing unit 31 or the detection signal analysis unit 32 of the image processing system includes one or more processors, samples the detected secondary electrons, and converts the amount of secondary electrons per unit time into pixel brightness, to generate a bitmap of the image.

Figure 3:
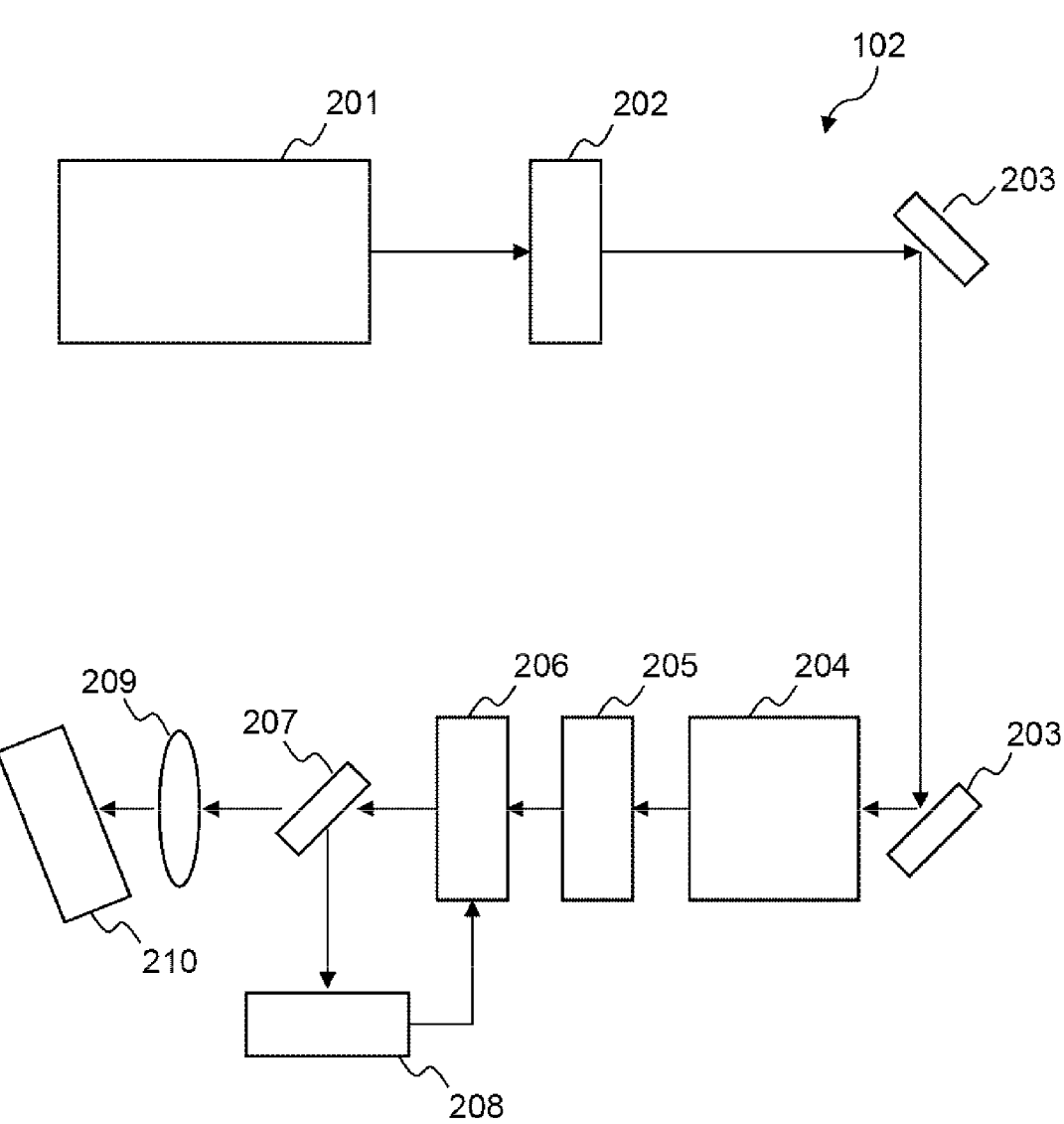
FIG. 3 is a diagram showing a configuration example of a laser beam irradiation unit 102.

FIG. 3 is a diagram showing a configuration example of the laser beam irradiation unit 102. The laser beam irradiation unit 102 is composed of a laser beam source 201, a pulse laser beam generator 202, an adjustment mirror 203, a wavelength controller 204, an intensity controller 205, a polarization angle controller 206, a beam splitter 207, a laser beam monitor 208, a condensing lens 209, and an incident angle adjuster 210. In Embodiment 1, the pulse laser beam generator 202 is separately provided in addition to the laser beam source 201, but the laser beam source 201 capable of irradiating pulse laser beam can also be used. In Embodiment 1, an acousto-optic modulator is used as the pulse laser beam generator 202, and the pulse laser beam is generated by generating diffracted light with an acoustic wave. It is also possible to employ a configuration in which for example, an electro-optical modulator is used to generate the pulse laser beam or a configuration in which a pulse laser beam is generated by arranging a shutter in the rear stage and opening and closing the shutter at high speed. In Embodiment 1, the pulse laser beam generator 202 is not driven, and the continuous laser beam is passed through the pulse laser beam generator 202 as it is.

In Embodiment 1, a plurality of adjustment mirrors 203 are provided so that the position and angle of the laser beam can be adjusted. A unit incorporating a nonlinear optical crystal was used as the wavelength controller 204, an optical filter was used as the intensity controller 205, and a polarizing plate was used as the polarization angle controller 206. A beam splitter 207 is used to irradiate a laser beam monitor 208 with part of the laser beam. As the laser beam monitor 208, a measuring instrument capable of measuring the position, angle, intensity distribution, and the like of the laser beam is used, and the measurement results can be fed back to the laser beam source, the pulse laser beam generator, the adjustment mirror, the wavelength controller, the intensity controller, the polarization angle controller, or the like. The condensing lens 209 is configured so that one condensing lens can be selected from a plurality of condensing lenses having different focal lengths, and a plurality of spot sizes can be selected. Although the laser stage is used as the incident angle adjuster 210 in Embodiment 1, it is also possible to adjust the incident angle using a mirror.

Figure 4:
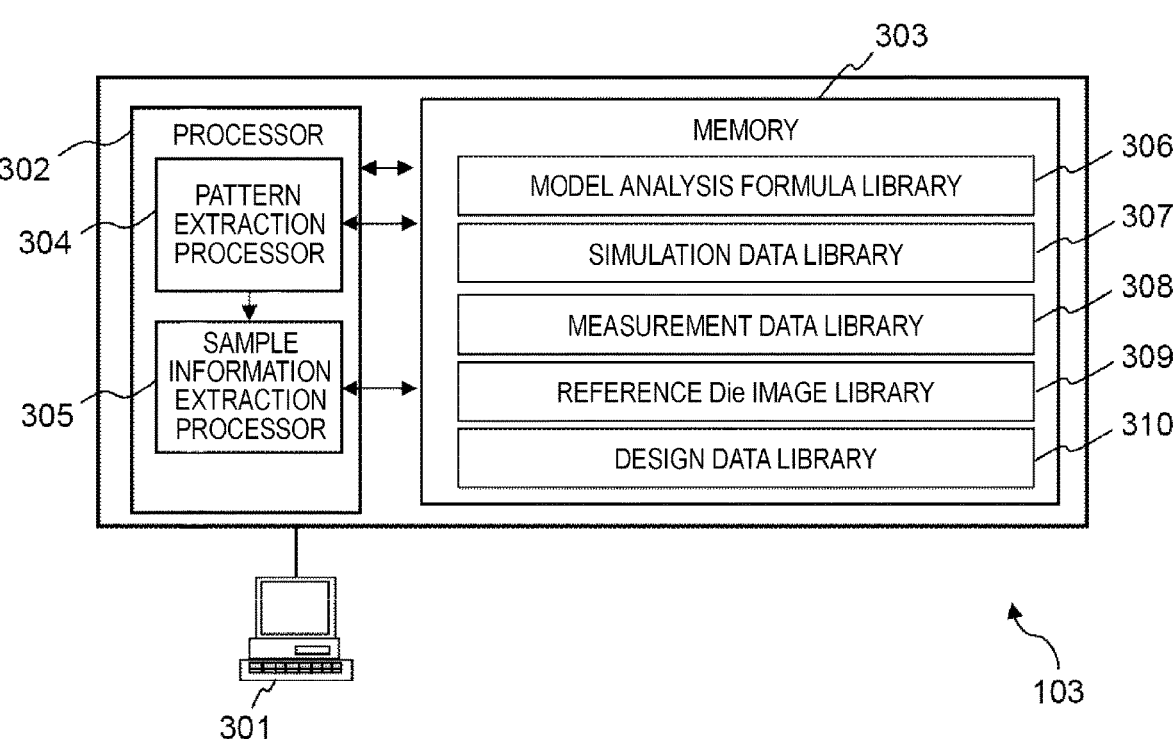
FIG. 4 is a diagram showing a configuration example of a computer system 103.

FIG. 4 is a diagram showing a configuration example of the computer system 103. The computer system 103 incorporates a memory 303 in which modules (applications) required to extract patterns from the image caused by standing waves produced by light interference and to obtain information about the sample are stored, and one or more processors 302 that execute the modules and applications stored in the memory 303. The processor 302 automatically or semi-automatically performs processing as described below. The computer system 103 includes an input/output device 301 for storing sample information and inputting/outputting information required for arithmetic processing. Sample information is sample information that can be determined from the conditions under which interference occurs and is sample shape, dimensions, height, sidewall angle, dielectric constant, dielectric constant, magnetic permeability, light absorption rate, side curvature, bowing, necking, defects, voids, material information, diffusion rate, mobility, and the like. Information required for storing sample information and arithmetic processing includes an image acquired by the scanning electron microscope 101.

The computer system 103 is configured to be able to communicate with the scanning electron microscope 101 and the laser beam irradiation unit 102.

The memory 303 stores a model analysis formula library 306, a simulation data library 307, a measurement data library 308, a reference die image library 309, and a design data library 310.

The processor 302 includes an interference pattern extraction processor 304 that mainly executes arithmetic processing to extract from the image a pattern caused by standing waves produced by interference of light, and a sample information extraction processor 305 that accepts position and time information of the pattern extracted from the image and mainly executes arithmetic processing that outputs information on the sample with reference to memory 303. The pattern position information includes pattern position, interval, width, number of lines, local changes in position, and the like.

The model analysis formula library 306 is a database in which model analysis formulas are stored. The model analysis formula includes (a) a response function used to output an indicator to determine whether the pattern in the image is caused by standing waves produced by interference of light when the pattern in the image and the measurement conditions are input to the interference pattern extraction processor 304, and (b) a response function used by the sample information extraction processor 305 to output information on the sample when the image patterns extracted by the interference pattern extraction processor 304 and the measurement conditions are input to the sample information extraction processor 305. The measurement conditions include the conditions of the sample input from the input/output device 301, the conditions of the scanning electron microscope, the conditions of the laser beam irradiation unit, the conditions of the synchronization control system, and the like.

The simulation data library 307 is a database in which images simulated using measurement conditions, sample information, and the above-described model analysis formula are stored. The processor 302, the interference pattern extraction processor 304, and the sample information extraction processor 305 perform arithmetic processing based on a set of a data set including the database and the image input from the input/output device 301, thereby outputting sample information. For example, the interference pattern extraction processor 304 first performs semantic segmentation to classify regions of the image, and then the sample information extraction processor 305 associates the result of classifying the database image regions such that the normalized correlation coefficient is maximized with the result of classifying the image regions input from the input/output device 301, thereby outputting the sample information.

The measurement data library 308 is a database in which images acquired by the scanning electron microscope 101 are stored in association with image-related information. The image-related information includes sample design data stored in a design data library 310 to be described later, the above-described measurement conditions, date and time, information output from the device used to manufacture the sample, and information output from the device (other than the scanning electron microscope 101) used to observe the sample. The processor 302, the interference pattern extraction processor 304, and the sample information extraction processor 305 perform arithmetic processing based on a set of a data set including the database and the image input from the input/output device 301, thereby outputting sample information. For example, the processor 302 uses a convolutional neural network to associate the database with the image input from the input/output device 301, thereby outputting sample information.

The reference die image library 309 is a database in which the images acquired by the scanning electron microscope 101 are classified and stored according to the images acquired at locations where the sample characteristics are the same or similar. The processor 302, the interference pattern extraction processor 304, and the sample information extraction processor 305 perform arithmetic processing based on a set of a data set including the database and the image input from the input/output device 301, thereby outputting sample information. For example, the processor 302 uses the k-nearest neighbor method to compare the result of classifying the image input from the input/output device 301 with the classification of the database, thereby outputting sample information.

The design data library 310 is a database storing design data. The design data is, for example, data relating to the dimensions, material, and the like of a sample produced by a computer-aided design (CAD) tool.

Figure 5:
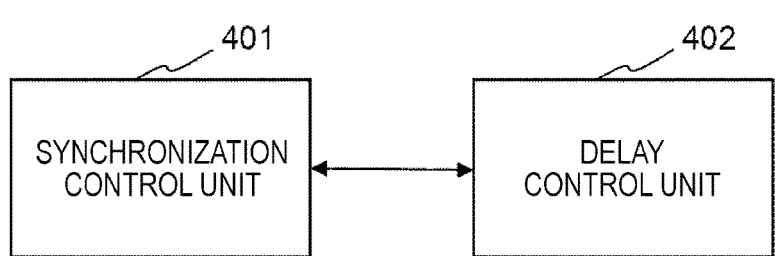
FIG. 5 is a diagram showing a configuration example of a synchronization control system 104.

FIG. 5 is a diagram showing a configuration example of the synchronization control system 104. The synchronization control system 104 is composed of a synchronization control unit 401 and a delay control unit 402. The synchronization control unit 401 synchronizes the time between the scanning electron microscope 101 and the laser beam irradiation unit 102. The delay control unit 402 controls the delay time between the synchronization control unit 401 and the scanning electron microscope 101 and the delay time between the synchronization control unit 401 and the laser beam irradiation unit 102.

Figure 6:
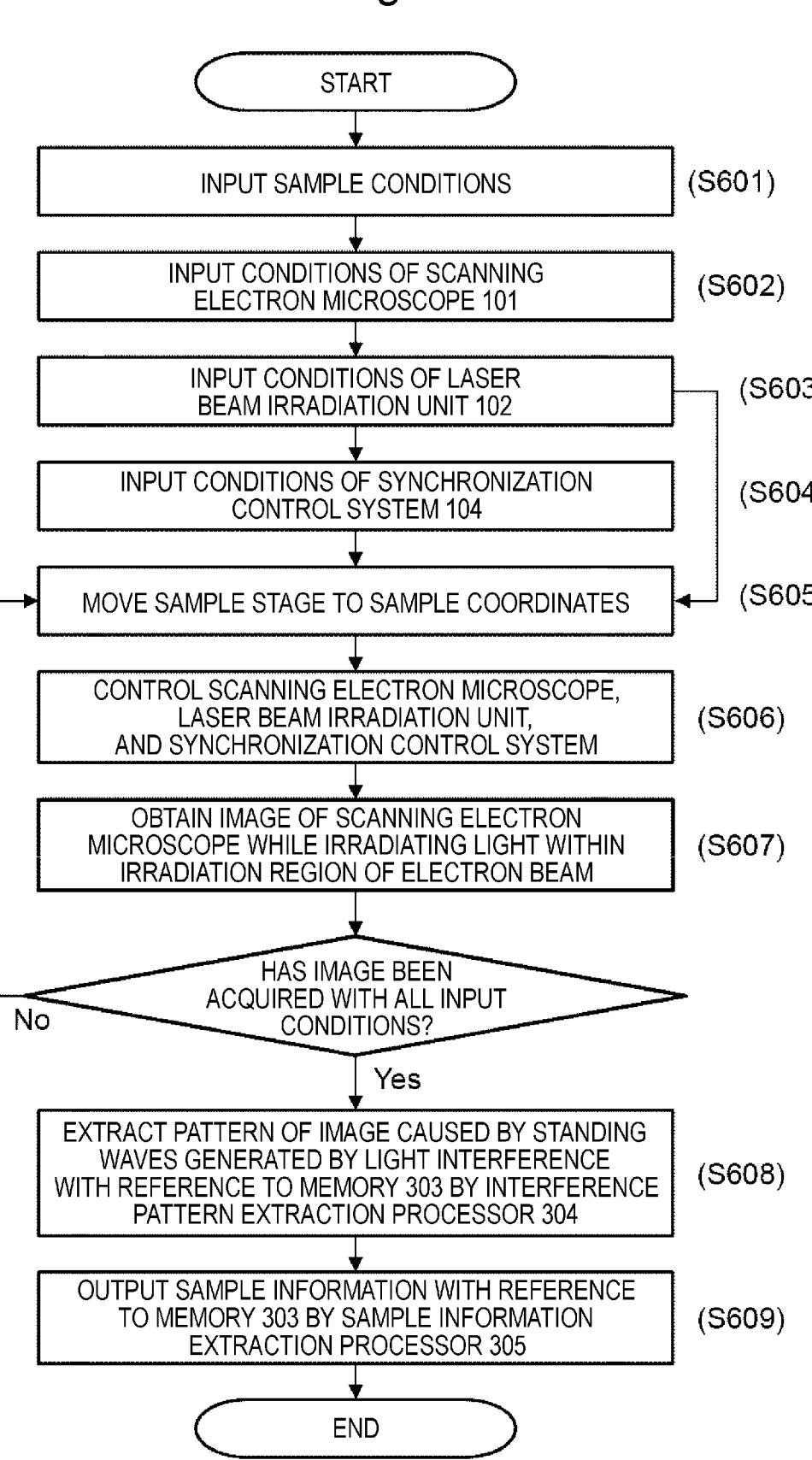
FIG. 6 is a flowchart showing a process of acquiring information on a sample by the charged particle beam system 100.

FIG. 6 is a flowchart showing a process of acquiring information on a sample by the charged particle beam system 100. This flowchart is implemented by the computer system 103. The same applies to flowcharts to be described later. Each step in FIG. 6 will be described below.

(FIG. 6: Step S601)

The user inputs sample conditions via the input/output device 301, for example. The sample information is information such as sample coordinates and information stored in the memory 303 (for example, sample design data). The computer system 103 receives the information. The same applies to the information input in S602 to S604.

(FIG. 6: Step S602)

The user inputs conditions of the scanning electron microscope 101 via the input/output device 301, for example. The conditions of the scanning electron microscope 101 include acceleration voltage, irradiation current, irradiation time, irradiation distance, cutoff time, distance between irradiation points, deflection distance, deflection speed, magnetic field of condenser lens and objective lens, sample electric field, and the like.

(FIG. 6: Step S603)

The user inputs the conditions of the laser beam irradiation unit 102 via the input/output device 301, for example. The conditions of the laser beam irradiation unit 102 include the wavelength of the laser beam, the incident angle, the polarization angle, the spot size, the power, the pulse width that is the time during which the laser beam is continuously irradiated, the period of the pulse laser beam, and the like.

(FIG. 6: Step S604)

The user inputs the conditions of the synchronization control system 104 via the input/output device 301, for example. The conditions of the synchronization control system 104 include the delay time between the synchronization control unit 401 and the scanning electron microscope 101, the delay time between the synchronization control unit 401 and the laser beam irradiation unit 102, and the like. This step may be skipped. If this step is skipped, a preset default value for the delay time is entered.

(FIG. 6: Steps S605 to S607)

The computer system 103 moves the sample stage 10 to the coordinates of the sample (S605). The computer system 103 controls the scanning electron microscope 101, the laser beam irradiation unit 102, and the synchronization control system 104 based on S602 to S604 (S606). The computer system 103 obtains an observed image of the sample from the scanning electron microscope 101 while irradiating light within the irradiated region of the electron beam according to the control conditions in S606 (S607). If a plurality of conditions are input in S601 to S604, S605 to S607 are repeated until observed image acquisition is completed for all conditions.

(FIG. 6: Step S608)

The interference pattern extraction processor 304 refers to the memory 303 and extracts an image pattern caused by standing waves generated by light interference. In Embodiment 1, the degree of matching between the interval (ΔL) of the striped pattern that periodically appears in the image and the interval (ΔL) of the striped pattern calculated from Equation 1 stored in the model analysis formula library 306 is used as an indicator, and a pattern whose degree of matching exceeds a threshold is extracted as an image pattern caused by standing waves generated by light interference. λ is the wavelength of the laser beam, θ is the incident angle of the laser beam, and a is the sidewall angle.

[Formula 1]

$$\Delta L = \lambda \cos\left(\theta + \alpha - \frac{\pi}{2}\right) \tag{1}$$

(FIG. 6: Step S609)

The sample information extraction processor 305 refers to the memory 303 and outputs sample information. In Embodiment 1, the position of the pattern of the image extracted from the image (the position of the pattern of the image located furthest from the sample pattern to be observed ($L_n$), or the position of the pattern of the image located closest to the sample pattern to be observed ($L_1$)), the number of patterns (n), and the pattern interval (ΔL) were extracted from the observed image, and the incident angle (θ) of the laser beam, which was input beforehand, was obtained, Equation 2 or Equation 3 stored in the model analysis formula library 306 was referred to, and then either the sample height (H) or sidewall angle (α) stored in the design data library 310 was referred to and the other was output.

[Formula 2]

$$H = L_n \tan\left(\theta + \alpha - \frac{\pi}{2}\right) \tag{2}$$

[Formula 3]

$$H = \{(n-1)\Delta L + L_1\} \tan\left(\theta + \alpha - \frac{\pi}{2}\right) \tag{3}$$

(FIG. 6: Step S608: Supplement)

In S608, the striped pattern interval (ΔL) calculated from Equation 1 was used as a comparison target with the striped pattern interval (ΔL) that periodically appears in the image, but the present disclosure is not limited thereto. For example, an image simulated using the measurement conditions, sample information, and model analysis formula stored in the simulation data library 307 may be used as a comparison target. Further, in Embodiment 1, the degree of matching between the interval (ΔL) of the striped pattern that periodically appears in the image and the interval (ΔL) of the striped pattern calculated from Equation 1 stored in the model analysis formula library 306 is used as an indicator to extract the pattern of the image caused by standing waves generated by the light interference, but the degree of matching may be used to determine whether or not the measurement conditions such as the conditions of the laser beam irradiation unit 102 are suitable. Further, in Embodiment 1, in S609, the sample height (H) and sidewall angle (α) stored in the design data library 310 are referred to, but the present disclosure is not limited thereto. For example, the result of measuring the sample height (H) with an atomic force microscope may be referred to, or the result of extracting the sidewall angle (α) from the observed image may be referred to.

FIG. 7 is a diagram showing an example of a user interface provided by the computer system 103. A Graphical User Interface (GUI) for inputting and displaying information to be input in S601 to S604 and a GUI for displaying sample information output in S609 are provided. These GUIs are displayed on a display device provided in the input/output device 301, for example. The GUI is provided with input fields for setting the coordinates of the sample. Input fields are also provided for setting information to be stored in the memory 303, such as sample design data. In addition, as input fields for setting the conditions of the scanning electron microscope, an input field for setting the size of the field of view (FOV), an input field for inputting the acceleration voltage of the electron beam, an input field for inputting the probe current of the electron beam, an input field for inputting the number of frames (accumulated number of images), an input field for setting the scanning speed of the electron beam, an input field for setting the magnitude of the voltage applied to the sample, and an input field for setting at least one or more of irradiation time, irradiation distance, cutoff time, and distance between irradiation points of the electron beam are provided. Also, as input fields for setting the conditions of the laser beam irradiation unit, an input field for setting the wavelength of the laser beam, an input field for setting the incident angle of the laser beam, an input field for setting the polarization angle of the laser beam, an input field for setting the spot size of the laser beam, an input field for setting the power of the laser beam, and an input field for setting one or more of the pulse width of the laser beam and the period of the pulse laser beam are provided. Also, an input field is provided for setting the difference in delay time between the scanning electron microscope 101 and the laser beam irradiation unit 102. An input field is also provided for setting an analysis method by the computer system 103. The analysis method by the computer system 103 may be manually set by the operator from the input field, or may be automatically selected by the device. A display field for displaying an image is also provided. In addition, a display field is provided for displaying the result of extracting the pattern of the image caused by the standing waves generated by the interference. In addition, an output field for displaying sample information is provided. In the present embodiment, the output height of the sample is displayed as the relationship between the height and the ID of the sample pattern, or illustrated as an estimated cross-sectional structure, or illustrated as a map of the relationship between the coordinates of the height and the sample. However, it is also possible to a display distribution such as a height frequency distribution and a cumulative frequency distribution.

Figure 8:
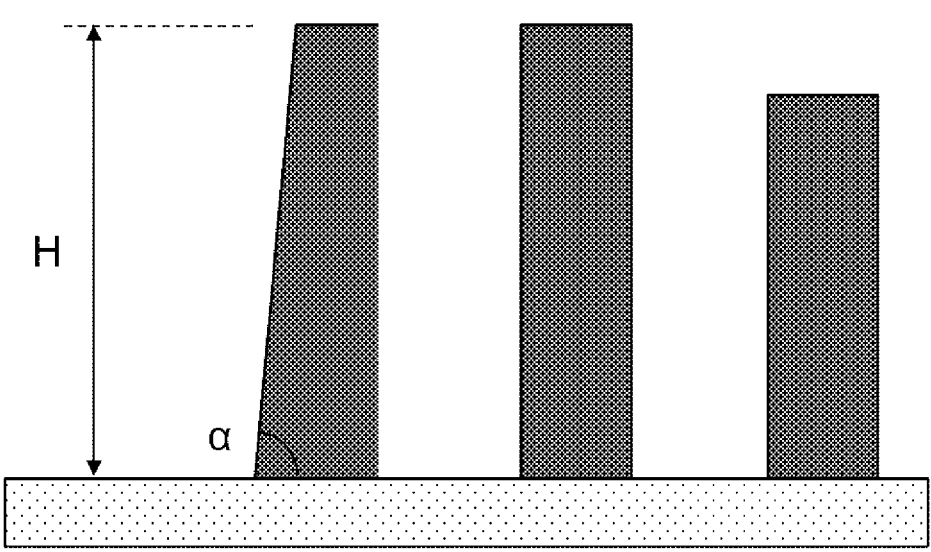
FIG. 8 is a diagram showing an example of a sample.

FIG. 8 is a diagram showing an example of a sample. The sample is a structure formed on a silicon wafer during the manufacture of a Fin Field-Effect Transistor (FinFET), and has a thin rectangular shape obtained by cutting out the silicon substrate. In Embodiment 1, information on the height (H) and sidewall angle ($\alpha$) of the strip shape is obtained.

Figure 9:
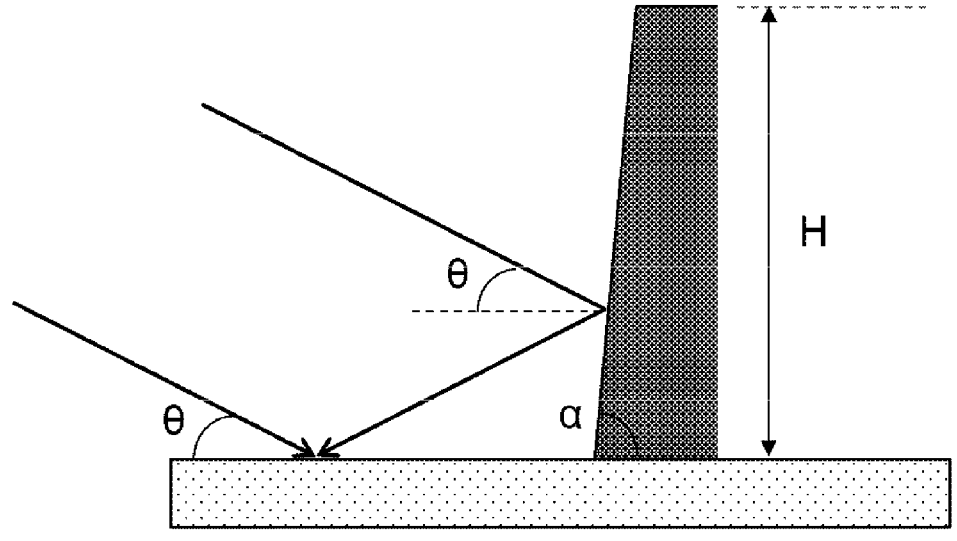
FIG. 9 is a diagram showing an example of a sample and laser beam.

FIG. 9 is a diagram showing an example of a sample and laser beam. A part of the laser beam irradiated onto the sample at the incident angle $\theta$ is reflected at the sidewall angle $\alpha$ and irradiated onto the upper surface of the silicon substrate. As a result, a standing wave is generated by interference between the light irradiated onto the upper surface of the silicon substrate after being reflected by the sidewall and the light irradiated onto the upper surface of the silicon substrate without being reflected by the sidewall, and the interval between standing waves occurs according to Equation 1. The sidewall angle $\alpha$ and the height H follow Equations 2 and 3. Therefore, first, the degree of matching between the interval ($\Delta L$) of the striped pattern that periodically appears in the image and the interval ($\Delta L$) of the striped pattern calculated from Equation 1 stored in the model analysis formula library 306 is used as an indicator, and a pattern whose degree of matching exceeds a threshold is extracted as an image pattern caused by standing waves generated by light interference. Next, the position of the pattern of the image extracted from the image (the position of the pattern of the image located furthest from the sample pattern to be observed ($L_n$), or the position of the pattern of the image located closest to the sample pattern to be observed ($L_1$)), the number of Payan(n), and the pattern interval ($\Delta L$) are extracted from the observed image, and the incident angle ($\theta$) of the laser beam is obtained in advance, Equation 2 or Equation 3 stored in the model analysis formula library 306 was referred to, and then either the sample height (H) or sidewall angle ($\alpha$) stored in the design data library 310 is referred to and the other is output. Through the above process, the sample height H or sidewall angle $\alpha$ can be obtained.

In Embodiment 1, the sample height (H) and sidewall angle ($\alpha$) are quantitatively obtained by referring to Equation 2 or Equation 3, but a test can also be performed to determine whether the height H and sidewall angle $\alpha$ of the sample are in the specified conditions. For example, if the target value of the sample height H is $H_0$ and the tolerance is $H_1$, a pass test can be performed if the sample height (H) is $H_0 - H_1 < H < H_0 + H_1$, otherwise, a fail test can be performed using the charged particle beam system 100.

Embodiment 2

The charged particle beam system 100 according to Embodiment 2 of the present disclosure controls the surface potential of the sample to control the intensity of the pattern caused by standing waves generated by the light interference, and obtains information about the dielectric constant of the sample.

Figure 10:
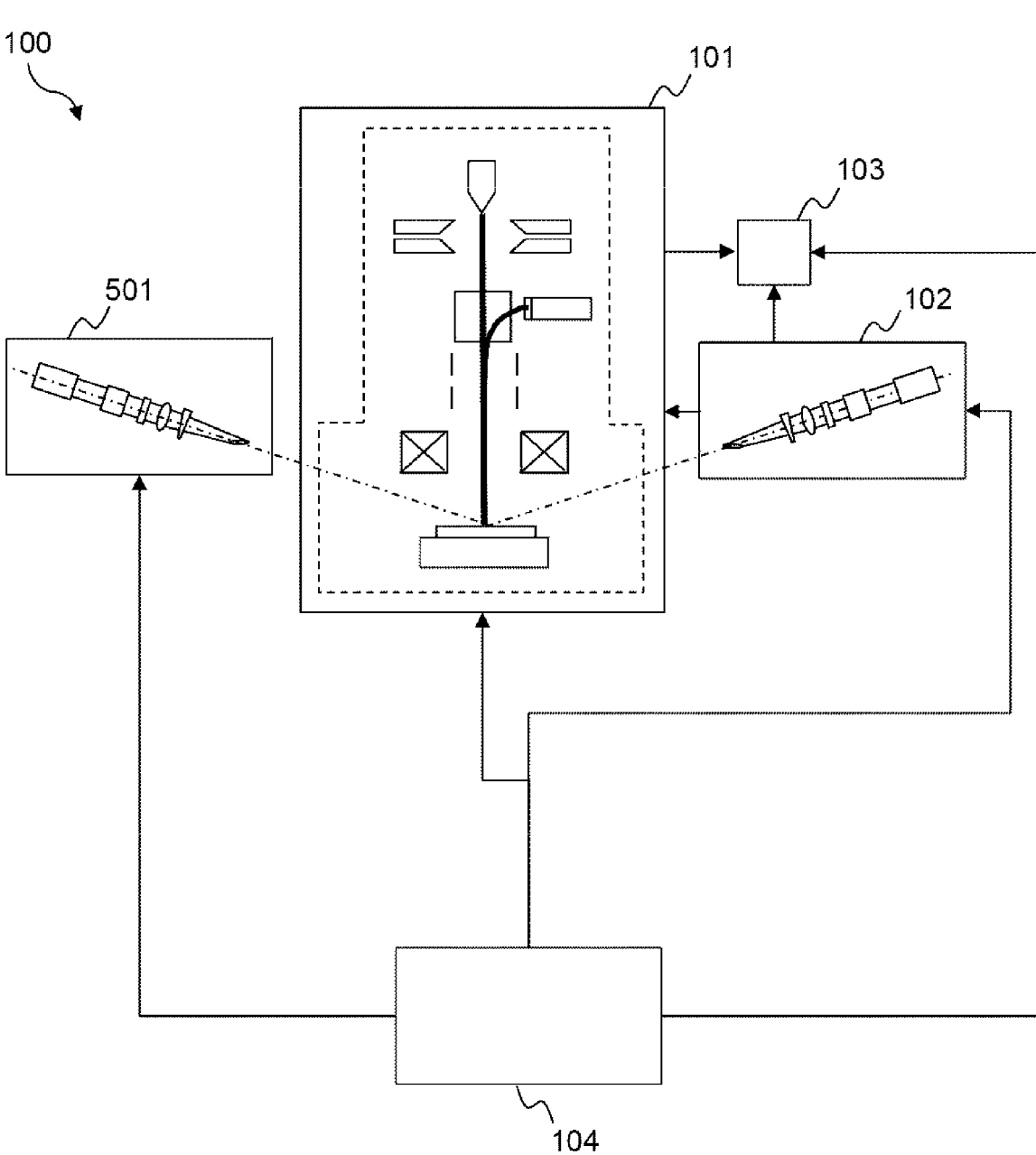
FIG. 10 is a diagram showing a configuration example of the charged particle beam system 100 according to Embodiment 2.

FIG. 10 is a diagram showing a configuration example of a charged particle beam system 100 according to Embodiment 2. The charged particle beam system 100 illustrated in FIG. 10 includes a scanning electron microscope 101, a laser beam irradiation unit 102, a computer system 103, a synchronization control system 104, and a second laser beam irradiation unit 501, as in FIG. 1. In FIG. 1, standing waves generated by interference between the laser beam irradiated onto a sample and the laser beam whose optical path has changed after being irradiated onto the sample is detected. On the other hand, in FIG. 10, a plurality of laser beams irradiating the sample interfere with each other. Therefore, it is possible to form standing waves on the sample regardless of the structure or shape of the sample.

The scanning electron microscope 101, the laser beam irradiation unit 102, the computer system 103, the synchronization control system 104, and the second laser beam irradiation unit 501 are connected to each other or configured to communicate with each other. The scanning electron microscope 101, the laser beam irradiation unit 102, and the second laser beam irradiation unit 501 are configured to be able to irradiate the same sample with an electron beam and laser beam, respectively, and are configured to irradiate the electron beam within the laser beam irradiated region.

In Embodiment 2, the system of the scanning electron microscope 101 in FIG. 2, the system of the laser beam irradiation unit 102 in FIG. 3, the second laser beam irradiation unit 501, which has the same configuration as the laser beam irradiation unit 102 in FIG. 3, the computer system 103 in FIG. 4, and the synchronization control system 104 in FIG. 5 were used to observe the samples according to the flowchart in FIG. 6 or 12 described below and obtained information. Since the second laser beam irradiation unit 501 may irradiate the same sample as the laser beam irradiation unit 102 with a laser beam, for example, the second laser beam irradiation unit 501 may be configured to install a mirror on the optical path of the laser beam reflected from the sample.

Among the contrasts of the observed image of the scanning electron microscope 101, the contrast caused by the surface potential of the sample is called voltage contrast (VC). In Embodiment 2, the surface potential of the sample is controlled and the surface potential is detected as the voltage contrast of the image, thereby controlling the intensity of the pattern caused by the standing waves generated by the light interference. Specifically, in order to apply a surface potential to the sample, the acceleration voltage is first set to 500 V in the scanning electron microscope 101 to create a state in which the secondary electron emission rate from the sample is greater than 1, and the surface potential of the sample is set to a positive potential. Next, the irradiation current was set to 1 nA, the irradiation time was set to any one of 10 ps to 1 ns, and the cutoff time was set to any one of 90 ps to 9 ns, and an alternating current was applied to the sample. Next, the wavelength of the laser beam was set to any one of 100 nm to 1000 nm, and the same sample was irradiated with the laser beam from the laser beam irradiation unit 102 and the second laser beam irradiation unit 501.

The laser beam has the effect of alleviating the charging of the sample. For example, if the energy of the laser beam is greater than the bandgap of the sample, when the positively charged sample is irradiated with the laser beam, electrons in the valence band are excited in the conductor, and thus, some of the positive charges are removed by negatively charged electrons. Since the effect of alleviating the electrification of the sample is greater at the portion where the laser beams interfere and strengthen each other, the surface potential of the sample becomes smaller at the portion where the laser beams interfere and strengthen each other. Therefore, a pattern caused by standing waves generated by light interference can be detected as voltage contrast.

Figure 11:
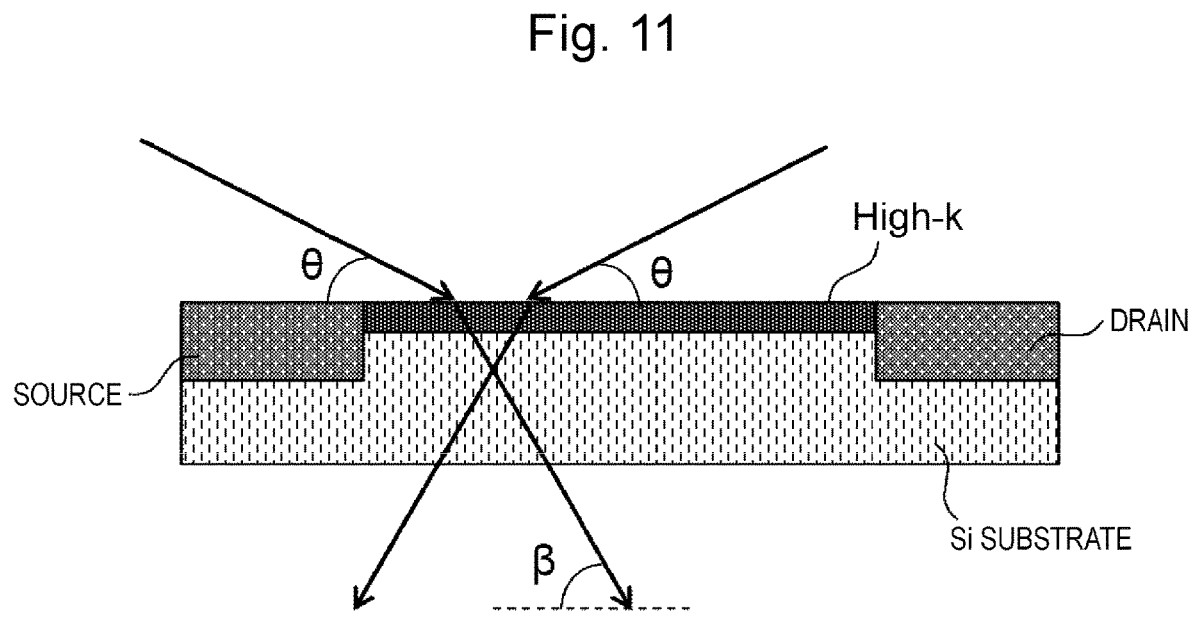

FIG. 11 is a diagram showing an example of a sample and laser beam. The sample has a structure in which a source, a drain, and a gate oxide film are formed on a silicon wafer during the manufacture of a Field-Effect Transistor (FET). This sample uses a High-k film with a high dielectric constant as the gate oxide film. A compound containing hafnium is used for the High-k film, and HfSiO(N)/SiO$_2$ is used as an example.

When the High-k film is irradiated with laser beam, the laser beam is refracted and the wavelength changes in the gate oxide film. Since the angle of refraction ($\beta$) follows Snell's law, it is expressed as a function of dielectric constant ($\varepsilon_r$) and magnetic permeability ($\mu_r$), as expressed in Equation 4.

[Formula 4]

$$\frac{\sin\left(\frac{\pi}{2} - \theta\right)}{\sin\left(\frac{\pi}{2} - \beta\right)} = \sqrt{\varepsilon_r \mu_r} \tag{4}$$

The wavelength ($\lambda'$) in High-k films is a function of dielectric constant ($\varepsilon_r$) and magnetic permeability ($\mu_r$), as expressed in Equation 5. $\lambda$ is the wavelength of the laser beam in vacuum, and n is the refractive index of the laser beam.

[Formula 5]

$$\lambda^2 = \frac{\lambda}{n} = \frac{\lambda}{\sqrt{\varepsilon_r \mu_r}} \tag{5}$$

Focusing on the fact that the angle of refraction and the wavelength in the High-k film are functions of the dielectric constant, the standing wave pattern (for example, the pattern interval) generated by light interference extracted by the interference pattern extraction processor 304 is received by the sample information extraction processor 305 and arithmetic processing is performed with reference to the memory 303, thereby obtaining information on the dielectric constant of the sample.

Figure 12:
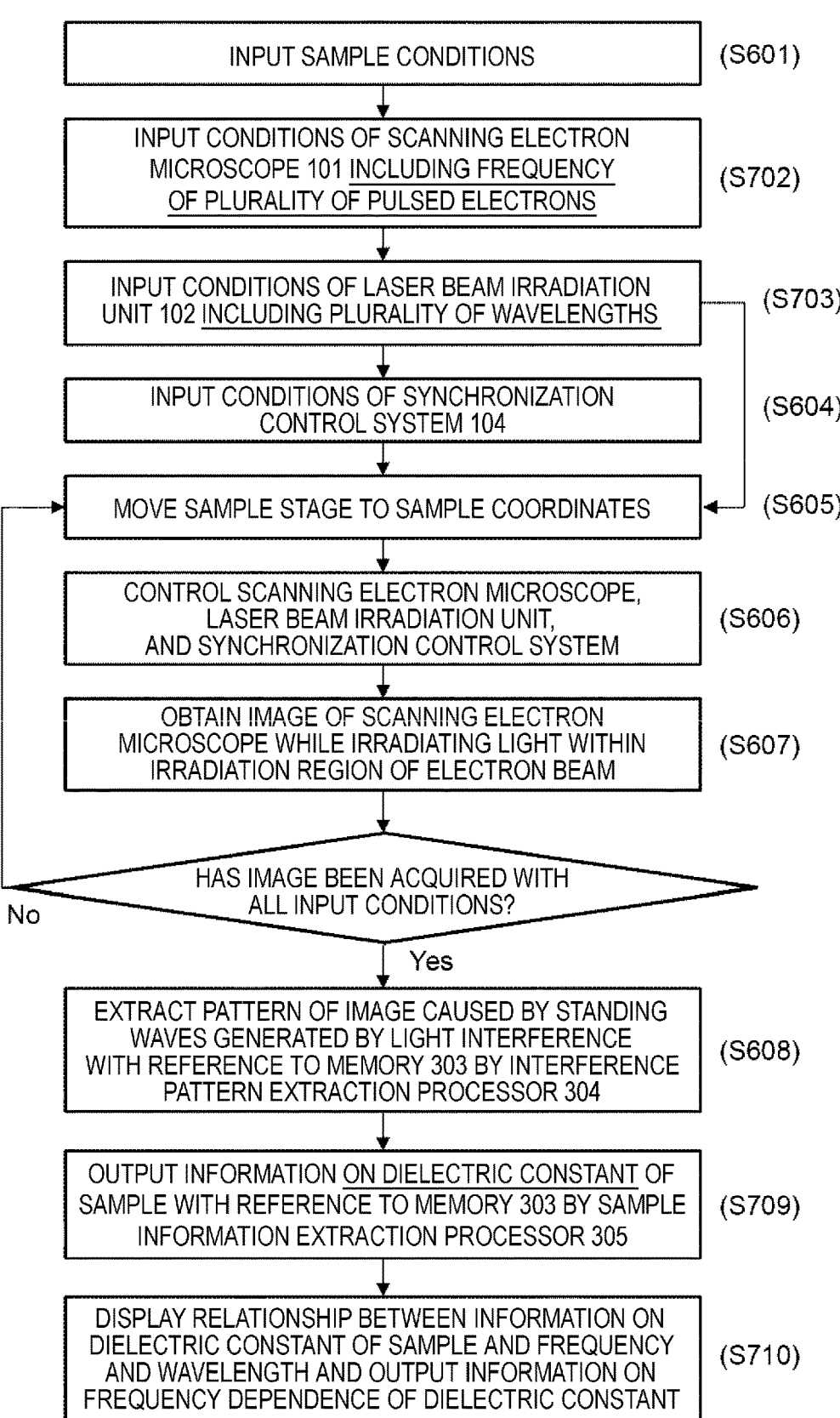
FIG. 12 is a flowchart showing a process of acquiring information on a sample by the charged particle beam system 100.

FIG. 12 is a flowchart showing a process of acquiring information on a sample by the charged particle beam system 100. The difference from FIG. 6 is that when the conditions for the scanning electron microscope 101 are input, the conditions are set so as to include a plurality of pulsed electron frequencies (S702), and when the conditions for the laser beam irradiation unit 102 are input, the conditions are set so as to include a plurality of wavelengths (S703), the sample information output by the sample information extraction processor 305 with reference to the memory 303 is information on the dielectric constant (S709), and after S709, information on the dielectric constant of the sample and the relationship between the frequency of the pulsed electrons and the wavelength of the laser beam are displayed in parallel, and a process of outputting information on the frequency dependence of the dielectric constant is included (S710).

The frequency of pulsed electrons is the reciprocal of the sum of the electron beam irradiation time and cutoff time (that is, the cycle of the electron beam). In Embodiment 2, the frequency of the pulsed electrons is variably controlled within the range of 0.1 GHz to 10 GHz while the ratio of the irradiation time to the cutoff time is fixed at 1:9. The wavelength of the laser beam was variably controlled in the range from 100 nm to 1000 nm. Since the wavelength of the laser beam can be converted into frequency, this is equivalent to variably controlling the frequency of the laser beam within the range of 0.3 PHz to 3 PHz.

In Embodiment 2, in S608, the pattern of the image caused by standing waves is extracted with reference to the simulation data library 307 in which the image simulated using the model analysis formula including Equations 4 and 5, the measurement conditions, and the sample information is stored. When extracting an image pattern caused by standing waves generated by light interference, the sample information extraction processor 305 first performs the Fourier transform on the image stored in the simulation data library 307 and outputs the spatial frequency and intensity of the power spectrum (S711). The sample information extraction processor 305 then performs the Fourier transform on the image acquired in S607 and outputs the spatial frequency and intensity of the power spectrum (S712). Finally, the sample information extraction processor 305 uses the degree of matching between the data in S711 and the data in S712 as an indicator, and a pattern with a degree of matching exceeding a threshold is regarded as an image pattern caused by standing waves generated by light interference.

In S710, the sample information extraction processor 305 calculated the dielectric relaxation frequency, which is the frequency at which dielectric polarization relaxes when the dielectric becomes unable to follow the vibration of the electron beam or laser beam, as information on the frequency dependence of the dielectric constant. Specifically, the sample information extraction processor 305 uses Equation 6 or Equation 7 stored in the model analysis formula library 306 to calculate the dielectric relaxation frequency ($f_0$ or $f_1$) by fitting the data on the relationship between the information on the dielectric constant of the sample and the frequency of pulsed electrons or the data on the relationship between the information on the dielectric constant of the sample and the frequency of the laser beam using the least square method. $\varepsilon_r$ is the dielectric constant, f is the frequency of the electron beam, f' is the frequency of the laser beam, $\varepsilon_{r0}$ is the dielectric constant when space charge polarization occurs, $\beta_{r1}$ is the dielectric constant when electronic polarization occurs, $f_0$ is the dielectric relaxation frequency of space charge polarization, and $f_1$ is the dielectric relaxation frequency of electronic polarization.

[Formula 6]

$$\varepsilon_r = \frac{\varepsilon_{r0}}{\left[1 + \left(\frac{f}{f_0}\right)^2\right]} \tag{6}$$

[Formula 7]

$$\varepsilon_r = \frac{\varepsilon_{r1}}{\left[1 + \left(\frac{f'}{f_1}\right)^2\right]} \tag{7}$$

FIG. 13 is the result of fitting data on the relationship between information on the dielectric constant of a sample and the frequency of pulsed electrons or laser beam. As a result of the fitting performed by the sample information extraction processor 305 using the data on the relationship between the information on the dielectric constant of the High-k film and the frequency of the pulsed electrons, and Equation 6, the dielectric relaxation frequency of the space charge polarization of the High-k film is obtained. Further, as a result of the fitting performed by the sample information extraction processor 305 using the data on the relationship between the information on the dielectric constant of the High-k film and the frequency of the laser beam, and Equation 7, the dielectric relaxation frequency of the electronic polarization of the High-k film is obtained. In addition, the dielectric constant of the High-k film with space charge polarization and the dielectric constant of the High-k film with electronic polarization could be obtained.

In Embodiment 2, a High-k film is used as a target for obtaining information on the dielectric constant and the frequency dependence of the dielectric constant. But it can be implemented using a Low-k film or dielectric films such as silicon oxide or silicon nitride, it can be implemented using ferroelectric films such as hafnium oxide, or it can be implemented using dielectric films with a plurality of compositions. In addition, when a film having a plurality of film types of the dielectric film is used, information on the composition ratio of the dielectric film can be obtained by utilizing the fact that the dielectric relaxation frequency ($f_0$ or $f_1$) differs depending on the film type. Information related to the dielectric constant, such as capacitance, porosity, and dopant concentration, can also be obtained from information on the dielectric constant and the frequency dependence of the dielectric constant. Also, the sample is not limited to a field-effect transistor, and a Ferroelectric Field-Effect Transistor (FeFET) or Negative Capacitance Field-Effect Transistor (NCFET) can also be used.

In Embodiment 2, the dielectric relaxation frequency is output as the information about the frequency dependence of the dielectric constant. However, other information known from the frequency dependence of the dielectric constant, for example, the dielectric tangent, phase margin, and gain margin, may be output.

In the flowchart shown in FIG. 12, information about the dielectric constant is output. However, since the angle of refraction and the wavelength in the High-k film are functions of the dielectric constant (Fr) and magnetic permeability ($\mu_r$) and the refractive index of light (n) as mentioned above, information on the magnetic permeability and the refractive index of laser beam may be output.

Embodiment 3

The charged particle beam system 100 according to Embodiment 3 of the present disclosure obtains information on the sidewall angle or dielectric constant or optical absorption coefficient or dimensions or sidewall curvature or bowing or necking or film thickness or depth of the sample from the pattern of images resulting from the interference of a plurality of rays of light generated as a result of refraction or propagation or diffraction of the laser beam incident on the sample.

In Embodiment 3, the system of the charged particle beam system of FIG. 1, the system of the scanning electron microscope 101 of FIG. 2, the system of the laser beam irradiation unit 102 of FIG. 3, the computer system 103 of FIG. 4, and the synchronization control system 104 of FIG. 5 were used.

Figure 14:
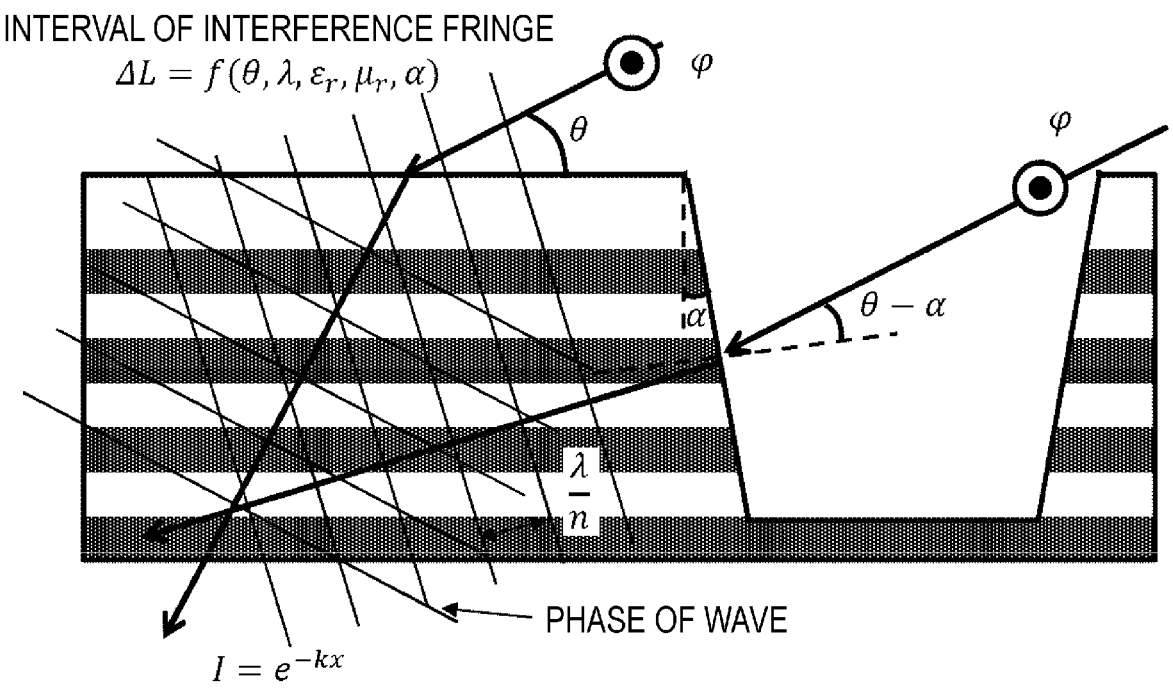
FIG. 14 is a diagram showing an example of a sample and laser beam.

FIG. 14 is a diagram showing an example of a sample and laser beam. The sample has a structure in which a hole for forming a memory is etched during the manufacture of a 3D-NAND flash memory, and the hole is formed in a stacked film of silicon oxide and silicon nitride. When a silicon oxide film or a silicon nitride film is irradiated with laser beam, the laser beam is refracted and the wavelength changes in the silicon oxide film or the silicon nitride film. At this time, since the relationship between the relative incident angle and the angle of refraction follows Snell's law shown in Equation 4, it is a function of dielectric constant ($\varepsilon_r$) and magnetic permeability ($\mu_r$).

The relative incident angle is the difference in angle between the irradiated sample surface and the laser beam irradiating the sample at an incident angle of $\theta$. Considering the laser beam incident on the sidewall, the relative incident angle is the difference between the incident angle ($\theta$) and the sidewall angle ($\alpha$). Also, the wavelength in the silicon oxide film or silicon nitride film is a function of the wavelength ($\lambda$) of the laser beam in vacuum, the dielectric constant ($\varepsilon_r$), and the magnetic permeability ($\mu_r$), as expressed by Equation 5. Furthermore, the position of the standing wave generated by light interference is a function of the polarization angle ($\varphi$), and the position changes when the laser beam is s-polarized, p-polarized, or circularly polarized. Furthermore, the intensity of the standing wave generated by the light interference is attenuated and reduced as the propagation distance (x) and the light absorption rate (k) are increased, as expressed by Equation 8.

[Formula 8]

$$I = e^{-kx} \tag{8}$$

Considering these factors, the position, interval, and intensity, which are characteristics of the pattern caused by standing waves generated by light interference, are functions of the incident angle (θ), wavelength (λ), dielectric constant (ε$_r$), magnetic permeability (μ$_r$), polarization angle (φ), sidewall angle (α), and light absorption rate (k). In Embodiment 3, when the sample is observed and information is acquired according to the flowchart of FIG. 6, the curvature of the sidewall, bowing, and necking were output by the sample information extraction processor 305 accepting the information on the position, interval, and intensity of the pattern and performing arithmetic processing with reference to the simulation data library 307 created according to the flowcharts of FIG. 16 or 17 to be described below.

Figure 15:
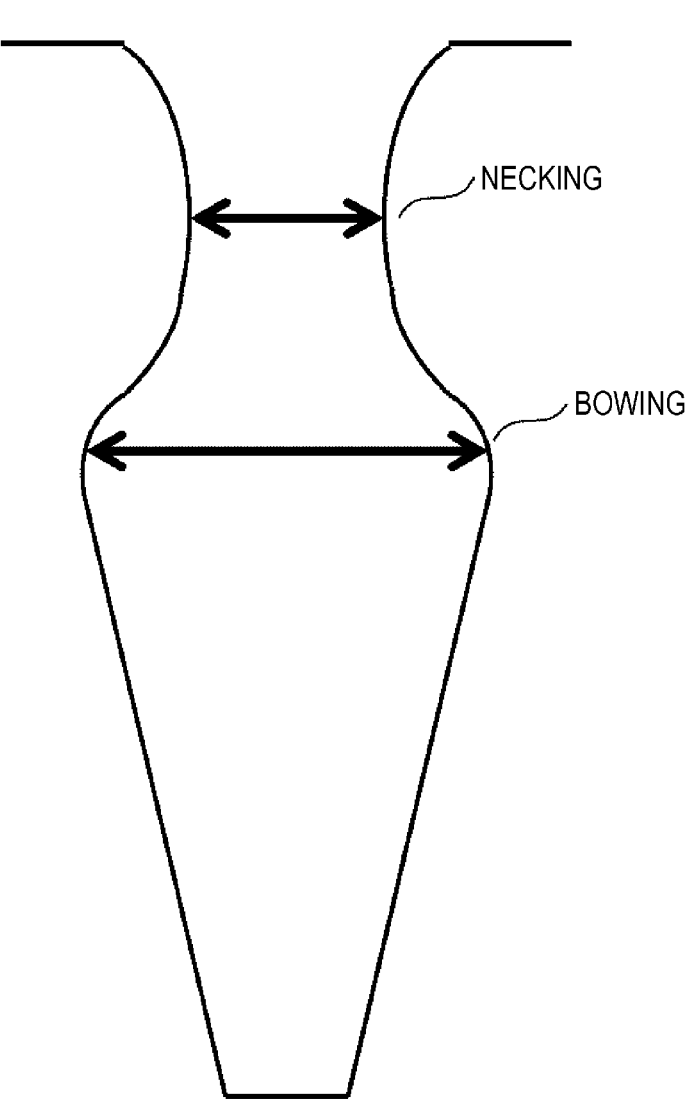
FIG. 15 is a diagram showing an example of bowing and necking.

FIG. 15 is a diagram showing an example of bowing and necking. Bowing is the diameter at the point where the diameter of the hole is the largest in a shape where the middle of the hole is barrel-shaped. Necking is the diameter at the point where the diameter of the hole is the smallest in a shape where the middle of the hole is barrel-shaped.

FIG. 16 is a flowchart illustrating a procedure for generating a database for a simulation data library 307. The simulation data library 307 in Embodiment 3 is a database created in advance according to the flowchart shown in FIG. 16 as an example. Each step in FIG. 16 will be described below.

(FIG. 16: Steps S801 to S803)

The processor 302 obtains the model analysis formula. In Embodiment 3, Equations 4 to 6 and Equation 8 are included as model analysis equations. The processor 302 acquires measurement conditions (S802). In Embodiment 3, the incident angle (θ), wavelength (λ), and polarization angle (φ) are input as measurement conditions. The processor 302 acquires the design information of the sample (S803). In Embodiment 3, the dielectric constant (ε$_r$), magnetic permeability (μ$_r$), light absorption rate (k), and hole diameter are output from the design data library 310 and input to the processor 302.

(FIG. 16: Step S804)

The processor 302 simulates an image using the calculated sample information as a variable. In Embodiment 3, the sidewall angle (α) is used as the sample information to be calculated. The sidewall angle (α) was set for each minute region of the sidewall, specifically, for each minute region obtained by dividing the sidewall of the stacked film for one layer into ten.

(FIG. 16: Step S805)

The processor 302 converts the calculated sample information into sample information to be output. In Embodiment 3, the sidewall angle (α), sidewall dimension, and sidewall shape for each minute region are converted into the sidewall curvature, bowing, and necking. If the calculated sample information and the sample information to be output match, this step may be skipped.

(FIG. 16: Step S806)

The processor 302 stores the sets including sample information and simulated images as a database in the simulation data library 307. In Embodiment 3, the sidewall curvature, bowing, and necking are set as sample information.

Figure 17:
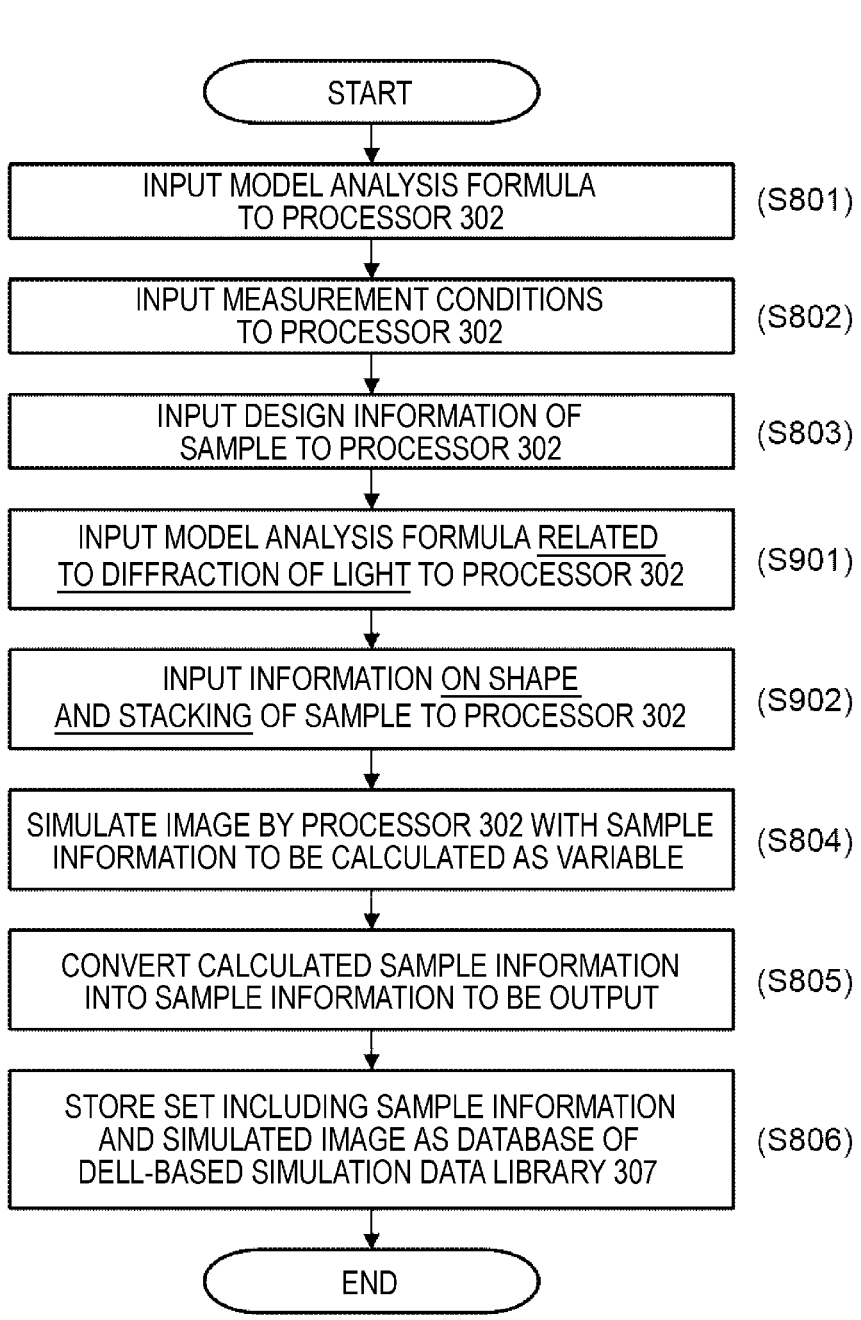
FIG. 17 is a flowchart illustrating another procedure for generating a database for a simulation data library 307.

FIG. 17 is a flowchart illustrating another procedure for generating a database for the simulation data library 307. The difference from FIG. 16 is that a model analysis formula related to light diffraction is input to the processor 302 (S901), and information about the shape and lamination of the sample is input to the processor 302 (S902).

The information on the shape and lamination of the sample includes the thickness of the stacked film, the number of layers, the depth at which bowing and necking occur, and the like. When a laser beam is incident on a stacked film of films having different dielectric constants as in Embodiment 3, the stacked film acts in the same way as a diffraction grating with respect to the laser beam, the patterns of interference caused by diffraction are superimposed on the image. The patterns of interference caused by diffraction include information that is difficult to obtain by patterns of interference in the absence of diffraction (for example, thickness of the stacked film, depth at which bowing or necking is occurring, and the like). Therefore, when observing the sample and acquiring information according to the flowchart of FIG. 6, the information can be acquired by referring to the simulation data library 307 created by the sample information extraction processor 305 according to the flowchart of FIG. 17.

In Embodiment 3, the model analysis formulas related to light diffraction phenomena, including the Fresnel diffraction and Fraunhofer diffraction equations, were entered into processor 302. In addition, the thickness of the silicon oxide film and the silicon nitride stacked film and the number of layers of the stacked film were entered into the processor 302 as information about the shape and lamination of the sample.

Figure 18:
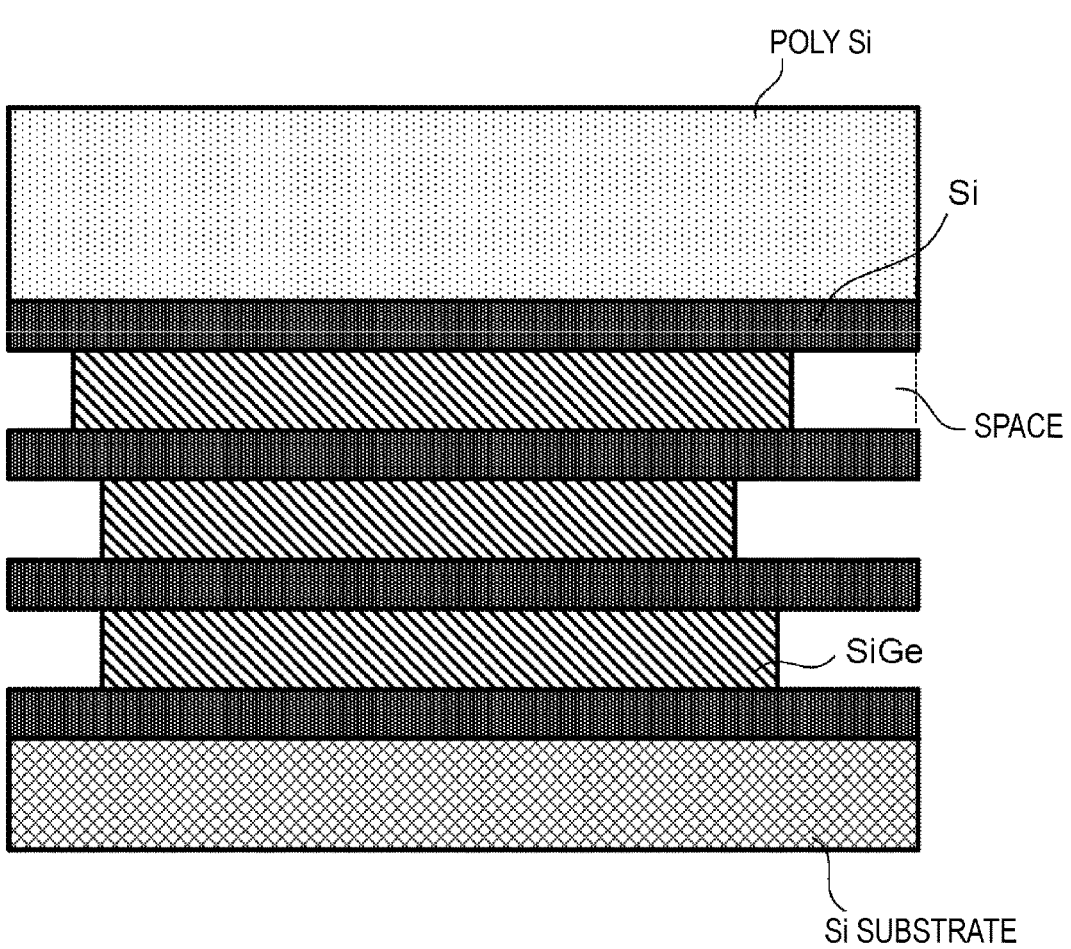
FIG. 18 is a diagram showing another example of the sample.

FIG. 18 is a diagram showing another example of a sample. The sample has a structure in which a space is formed by etching the sidewalls of SiGe in a superlattice of Si and SiGe during the manufacture of nanowires in which FETs of a Gate-All-Around (GAA) structure are stacked. In Embodiment 3, when creating the simulation data library 307 using the flowchart of FIG. 17, the dimension of the space and the curvature of the side surface of the sidewall of the space are set as the sample information in S806.

Figure 19:
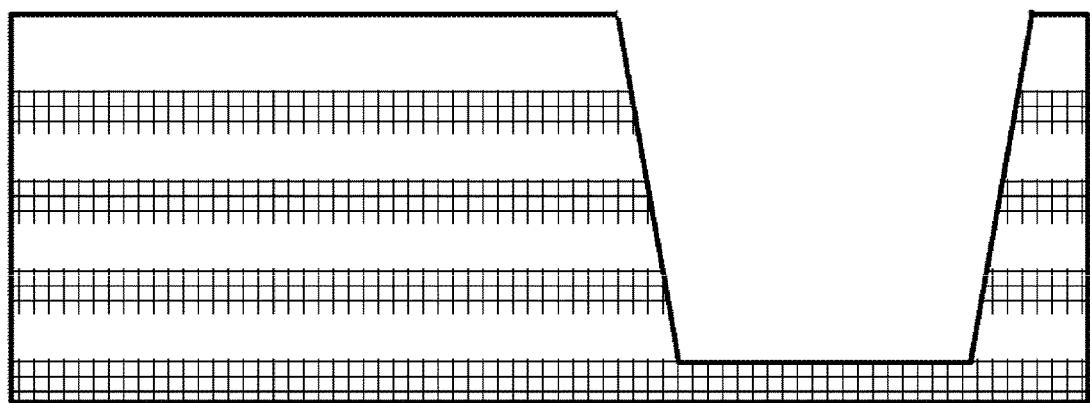
FIG. 19 is a diagram showing another example of the sample.

FIG. 19 is a diagram showing an example of a sample. The sample, like FIG. 14, has a structure in which a hole for forming a memory is etched during the manufacture of a 3D-NAND flash memory. A step of wet-etching the silicon nitride film in order to replace the silicon nitride film of FIG. 14 with a tungsten film is shown. The portion where the silicon nitride film originally existed is a cavity, but if the wet etching fails, a residual film is generated in the cavity. If a residual film occurs, the interference caused by diffraction changes. Therefore, when observing the sample and acquiring information according to the flowchart of FIG. 6, the information of the residual film can be acquired by referring to the simulation data library 307 created by the sample information extraction processor 305 according to the flowchart of FIG. 17.

Embodiment 4

The charged particle beam system 100 of Embodiment 4 of the present disclosure obtains, from a pattern of images resulting from standing waves generated by interference between a laser beam incident on a sample and a laser beam reflected from the sample reflected by a mirror, information on the height or film thickness or surface roughness or surface curvature or the shape of the surface deformations or scratch defects of the sample.

In Embodiment 4, the system of the charged particle beam system of FIG. 1, the system of the scanning electron microscope 101 of FIG. 2, the computer system 103 of FIG. 4, and the synchronization control system 104 of FIG. 5 were used.

Figure 20:
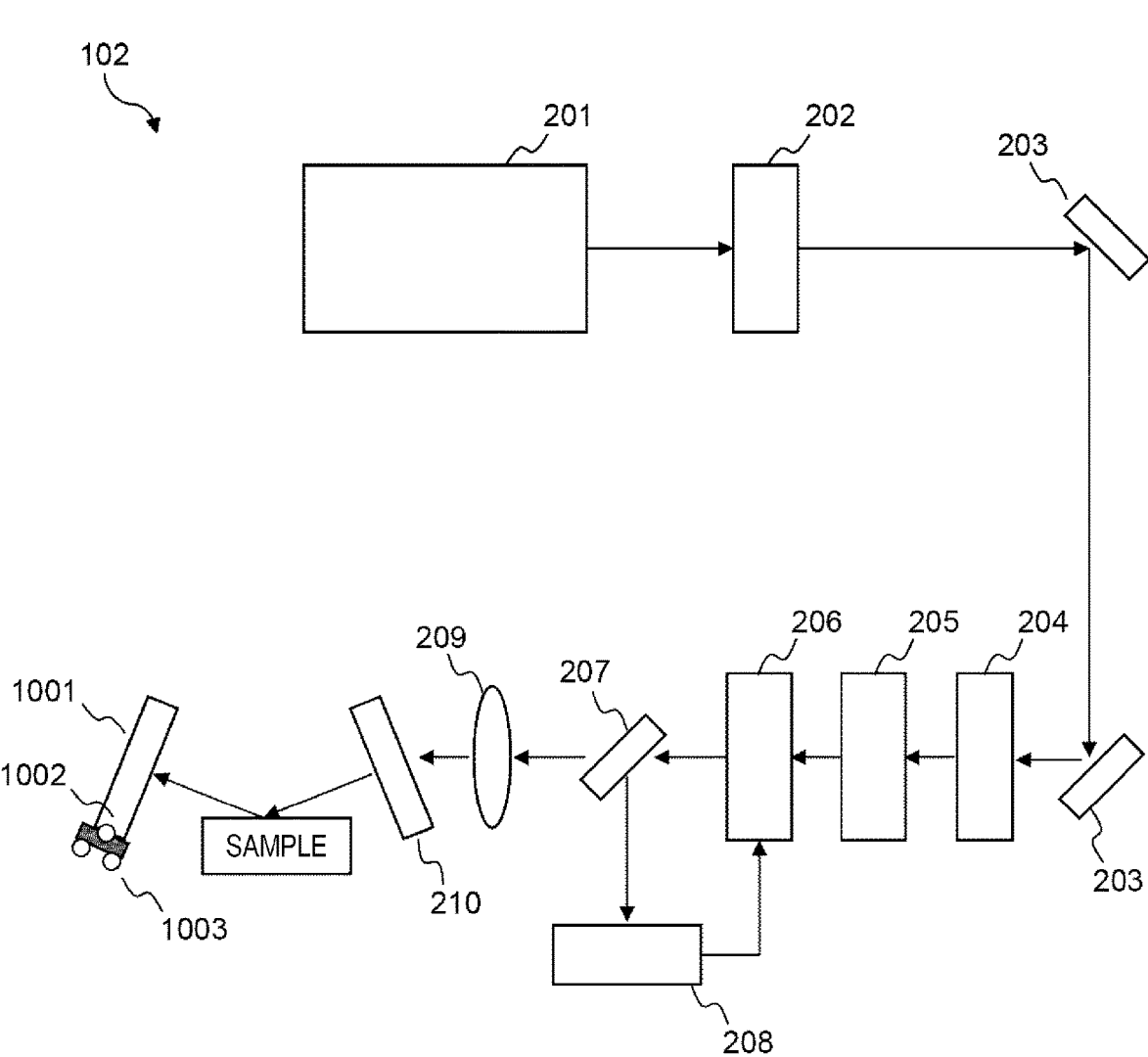
FIG. 20 is a diagram showing a configuration example of a system of the laser beam irradiation unit 102 according to Embodiment 4.

FIG. 20 is a diagram showing a configuration example of a system of the laser beam irradiation unit 102 according to Embodiment 4. In Embodiment 4, in addition to the constituent elements of the laser beam irradiation unit 102 of FIG. 3, a reflecting mirror 1001, a reflecting mirror angle adjuster 1002, and a reflection optical path length adjustment stage 1003 are provided. The angle of the reflecting mirror 1001 can be adjusted by the reflecting mirror angle adjuster 1002 so that the laser beam reflected from the sample is incident on the reflecting mirror 1001 perpendicularly. By moving the position of the reflecting mirror 1001 with the reflection optical path length adjustment stage 1003, it is possible to adjust the optical path until the laser beam reflected from the sample reaches the reflecting mirror 1001. In Embodiment 4, a piezo actuator is used to drive the reflection optical path length adjustment stage 1003.

Figure 21:
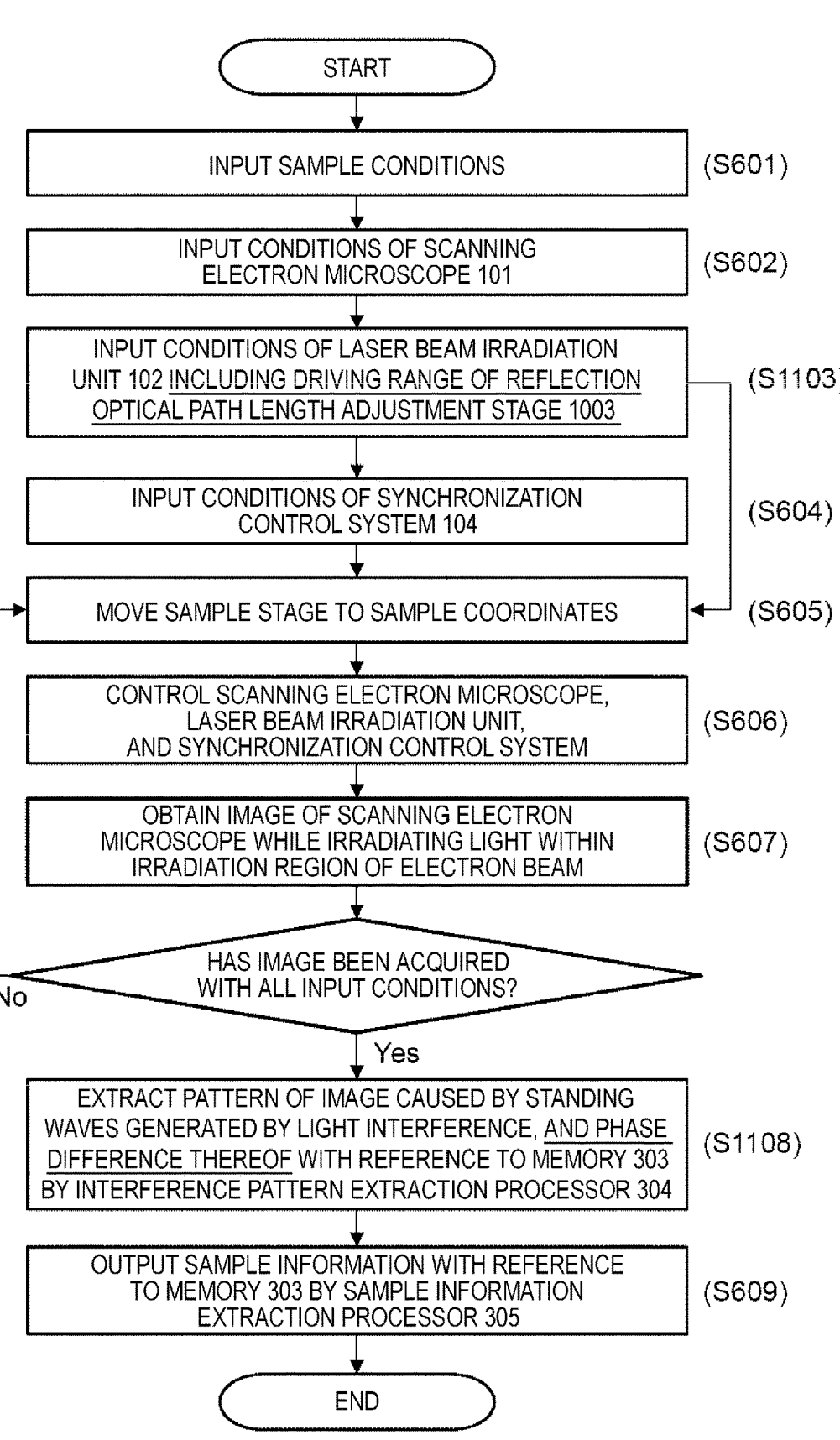
FIG. 21 is a flowchart showing a process of acquiring information on a sample by the charged particle beam system 100.

FIG. 21 is a flowchart showing a process of acquiring information on a sample by the charged particle beam system 100. The difference from FIG. 6 is that when the conditions of the laser beam irradiation unit 102 are input, the conditions are set so as to include the driving range of the reflection optical path length adjustment stage 1003 (S1103), and when extracting patterns in the image caused by standing waves generated by light interference with reference to the memory 303, the interference pattern extraction processor 304 also extracts phase differences of the standing waves superimposed on the patterns in the image (S1108).

In S1103, the reflection optical path length adjustment stage 1003 is arranged at a plurality of positions within the driving range, and an image is acquired at each position. Furthermore, the phase difference data of each pixel of the image is extracted from the images acquired at a plurality of positions. In S1108, by converting the phase difference data of each pixel into sample information so that there is no contradiction between adjacent pixels, sample information can be obtained with high resolution. Here, converting into sample information without contradiction includes, for example, a process of outputting sample information from the result of fitting the relationship between the pixel position and the phase difference data of each pixel with an error function.

Figure 22:
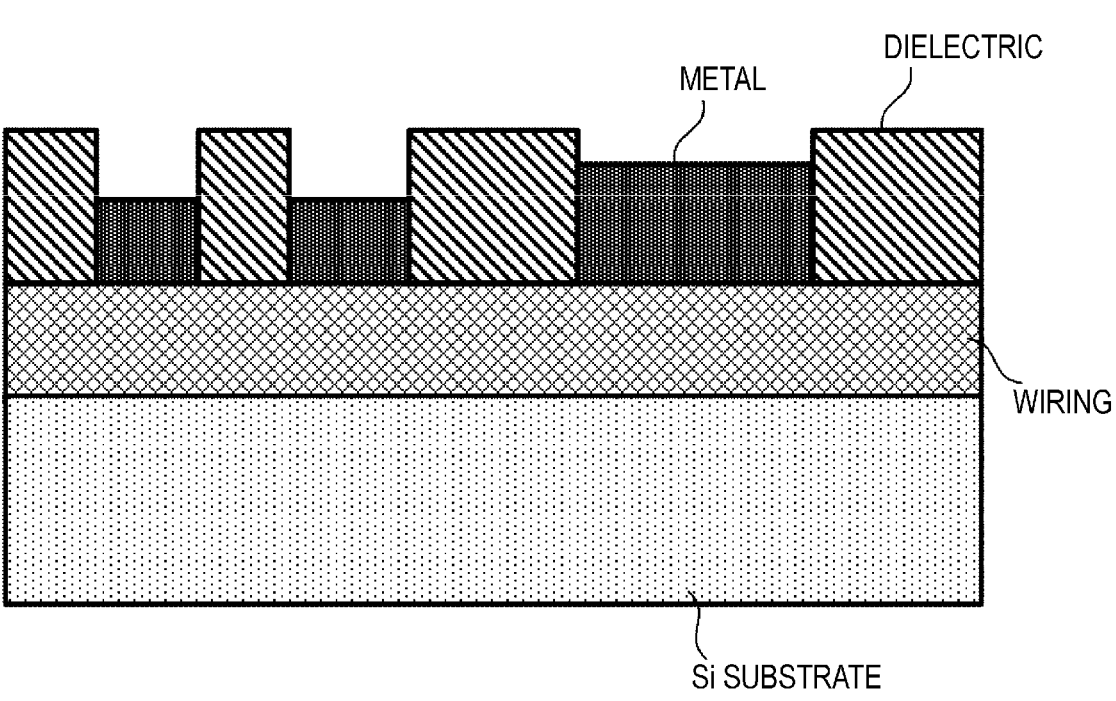
FIG. 22 is a diagram showing an example of a sample.

FIG. 22 is a diagram showing an example of a sample. The sample has a structure in which wiring is formed on a silicon wafer by the wiring process, and metal and dielectric films are formed thereon. Unlike conventional packaging, this is a sample for wafer bonding that does not use bumps to connect integrated circuits, but rather bonds silicon wafers together to establish electrical connections. The sample of FIG. 22 is characterized in that the height of the metal is several nanometers lower than that of the dielectric film, and that the surface of the dielectric film is flat while the surface of the metal is curved. The difference in height between the dielectric film and the metal is hereinafter referred to as a recess amount.

Figure 23:
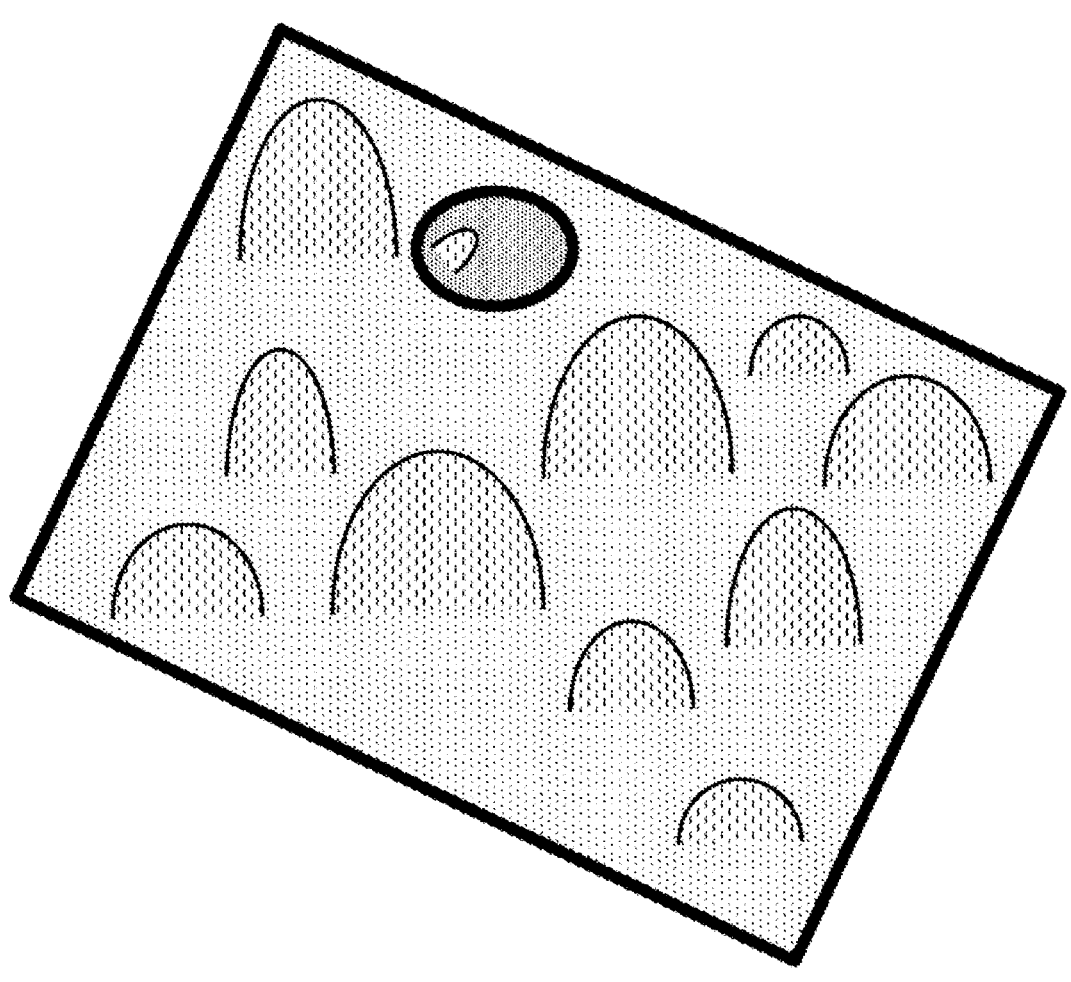
FIG. 23 is a diagram showing another example of the sample.

FIG. 23 is a diagram showing an example of a sample. The sample is a resist formed by agglomeration of fine particles and droplets of polymer resin, and the surface has roughness of several nanometers.

Figure 24:
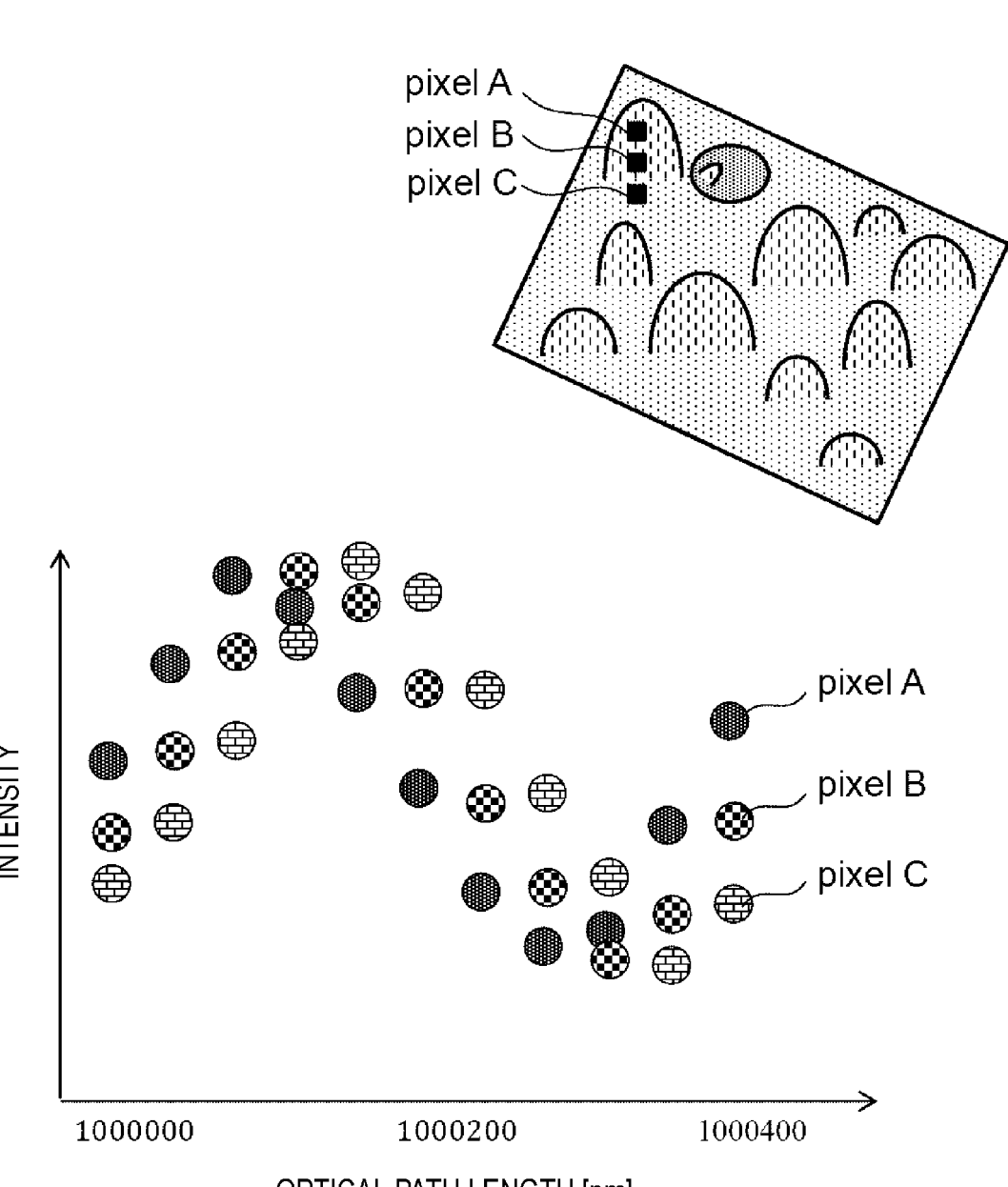
FIG. 24 shows an example of data illustrating the relationship between the optical path length from the reference surface of the sample until the laser beam reflected from the reference surface of the sample reaches a reflecting mirror 1001 and re-enters the reference surface of the sample, and the intensity of the pattern of the image at each pixel.

FIG. 24 shows an example of data illustrating the relationship between the optical path length from the reference surface of the sample until the laser beam reflected from the reference surface of the sample reaches a reflecting mirror 1001 and re-enters the reference surface of the sample, and the intensity of the pattern of the image at each pixel. The flat surface of the sample in FIG. 23 was used as the reference surface of the sample. The optical path length was controlled using a reflection optical path length adjustment stage 1003. The data are illustrated for three points: pixel A, located at the apex of the projection of the sample in FIG. 23, pixel C, located on the flat surface of the sample, and pixel B, located at the midpoint between pixel A and pixel B, respectively. The data has a sine wave shape, and when the optical path length moves by a distance equal to the wavelength of the laser beam, the phase of the sine wave changes by $2\pi$. In Embodiment 4, the wavelength of the laser beam is 400 nm. Therefore, when the optical path length is changed by 400 nm, the phase of the result of fitting the data with a sine wave changes by $2\pi$. When pixel C is used as a reference, pixel A has a $\pi/25$ phase fast and pixel B has a $\pi/50$ phase fast. Therefore, when pixel C is used as a reference, pixel A is 8 nm higher, and pixel B is 4 nm higher.

If the charged particle beam system 100 of Embodiment 4 is used to output the difference in height of each pixel of an image and display the height of each pixel in a bitmap, the roughness of the surface can be measured with nanometer-order or angstrom-order or sub-angstrom-order resolution. When the sample of FIG. 22 is used, the height and film thickness of the dielectric film and metal can be output by using the surface on which the wiring is formed in the wiring process as the reference surface of the sample.

When using the charged particle beam system 100 of Embodiment 4 and the flowchart of FIG. 21, it is possible to output information on the recess amount of the sample of FIG. 22, the curvature of the metal surface of the sample of FIG. 22, the metal surface deformation of the sample of FIG. 22, and the roughness of the surface of the sample of FIG. 23. Furthermore, it is also possible to extract and output only scratch defects (microscratches), which are scars left when metal is scratched, from the surface curvature of a dielectric solid film sample.

Embodiment 5

Figure 25:
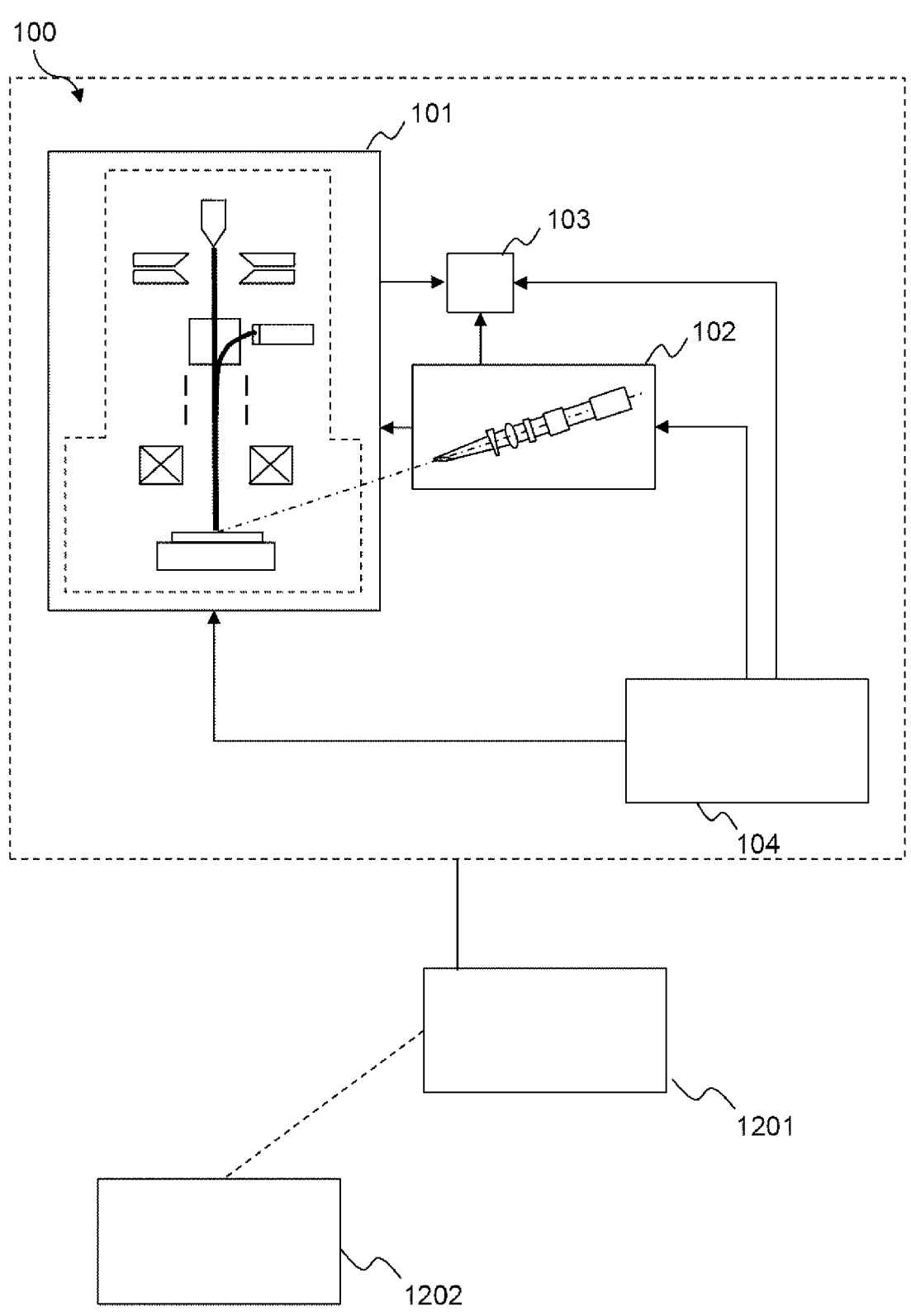
FIG. 25 is a configuration diagram of the charged particle beam system 100 according to Embodiment 5.

FIG. 25 is a configuration diagram of the charged particle beam system 100 according to Embodiment 5 of the present disclosure. The integrated system computer 1201 is connected to the charged particle beam system 100 or configured to be able to communicate with each other. In Embodiment 5, a system in which the integrated system computer 1201 is configured to communicate with the Chemical Mechanical Polishing (CMP) device 1202 is used, but it can be implemented without the CMP device 1202. The integrated system computer 1201 outputs recommended conditions for the semiconductor manufacturing apparatus based on the sample information. Integrated system computer 1201 may be configured as part of charged particle beam system 100. The sample shown in FIG. 22 is used in Embodiment 5.

Figure 26:
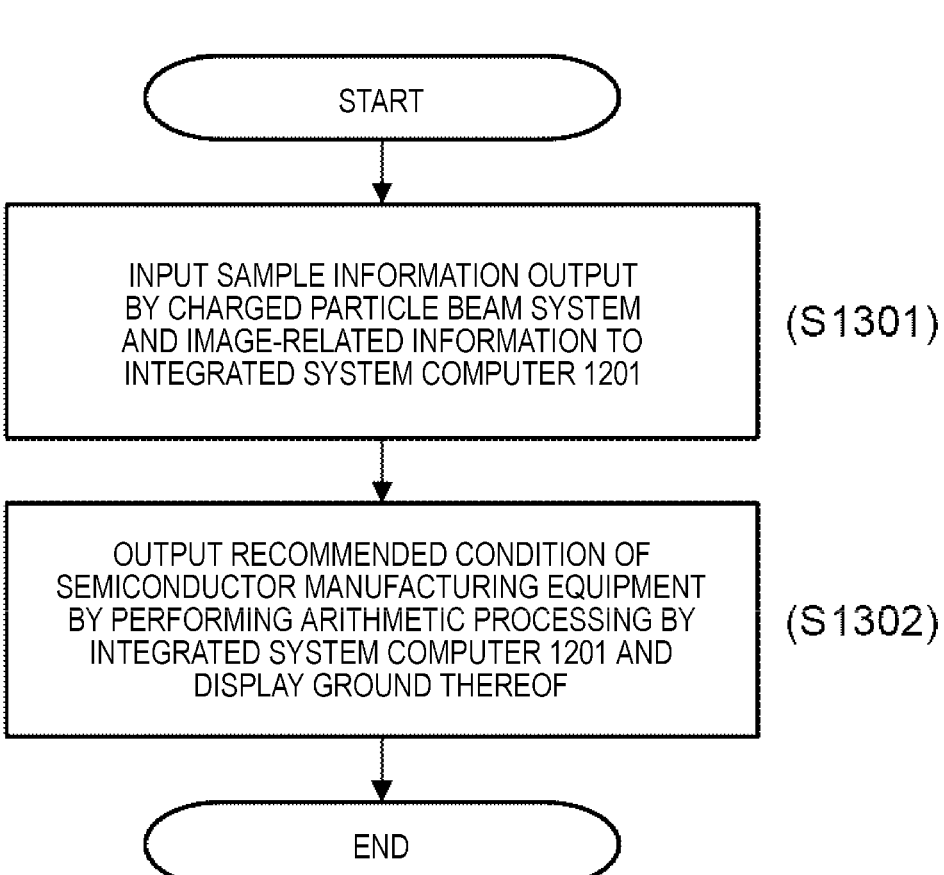
FIG. 26 is a diagram showing an example of a flowchart showing a process of inputting sample information output by the charged particle beam system 100 and outputting recommended conditions for a semiconductor manufacturing apparatus by an integrated system computer 1201.

FIG. 26 is a diagram showing an example of a flowchart showing a process of inputting sample information output by the charged particle beam system 100 and outputting recommended conditions for a semiconductor manufacturing apparatus by an integrated system computer 1201.

In S1301, sample information output by the charged particle beam system and image-related information are input to the integrated system computer 1201. The image-related information includes design data of the sample stored in the design data library 310, conditions of the scanning electron microscope, conditions of the laser beam irradiation unit, conditions of the synchronization control system, the type of arithmetic processing of the processor 302 of the computer system 103, the type of memory 303 referenced by the processor 302, the date and time, the model of the charged particle beam system, the individual identification number of the charged particle beam system, and the like.

In S1302, the integrated system computer 1201 performs arithmetic processing, outputs recommended conditions for the semiconductor manufacturing apparatus, and displays the grounds thereof. In the present example, recommended values for the hardness of the pad used in CMP, the type of slurry, the amount of slurry supplied, the type of dresser, the polishing pressure, and the height of the retainer ring were output. In order to output these recommended conditions, the integrated system computer 1201 has a learner that uses machine learning, such as a neural network, to learn the relationship between the information to be input in S1301, the intermediate information, and the recommended conditions.

In Embodiment 5, information on the amount of warpage of the wafer, the amount of waviness of the wafer, the amount of dishing, the amount of erosion, the amount of recess, and the roughness of the surface is used as the intermediate information. Further, in Embodiment 5, the intermediate information described above is displayed as the grounds for the recommended conditions for the semiconductor manufacturing apparatus, and hints for understanding the relationship between the intermediate information and the recommended conditions are also displayed. Specifically, the hint is information such as (a) when the amount of warpage at the outer periphery of the wafer is large, it tends to be better to lower the height of the retainer ring and apply pressure, and (b) when there is a lot of dishing, it tends to be better to increase the hardness of the pad. In addition to the results trained by the integrated system computer 1201 using the learner, such human know-how is input to the integrated system computer 1201 as hints.

Embodiment 6

The charged particle beam system 100 of Embodiment 6 of the present disclosure obtains, from a pattern of images resulting from standing waves generated by interference between a laser beam incident on a sample and a laser beam reflected from the sample reflected by a mirror, information on defects or voids in the sample.

Figure 27:
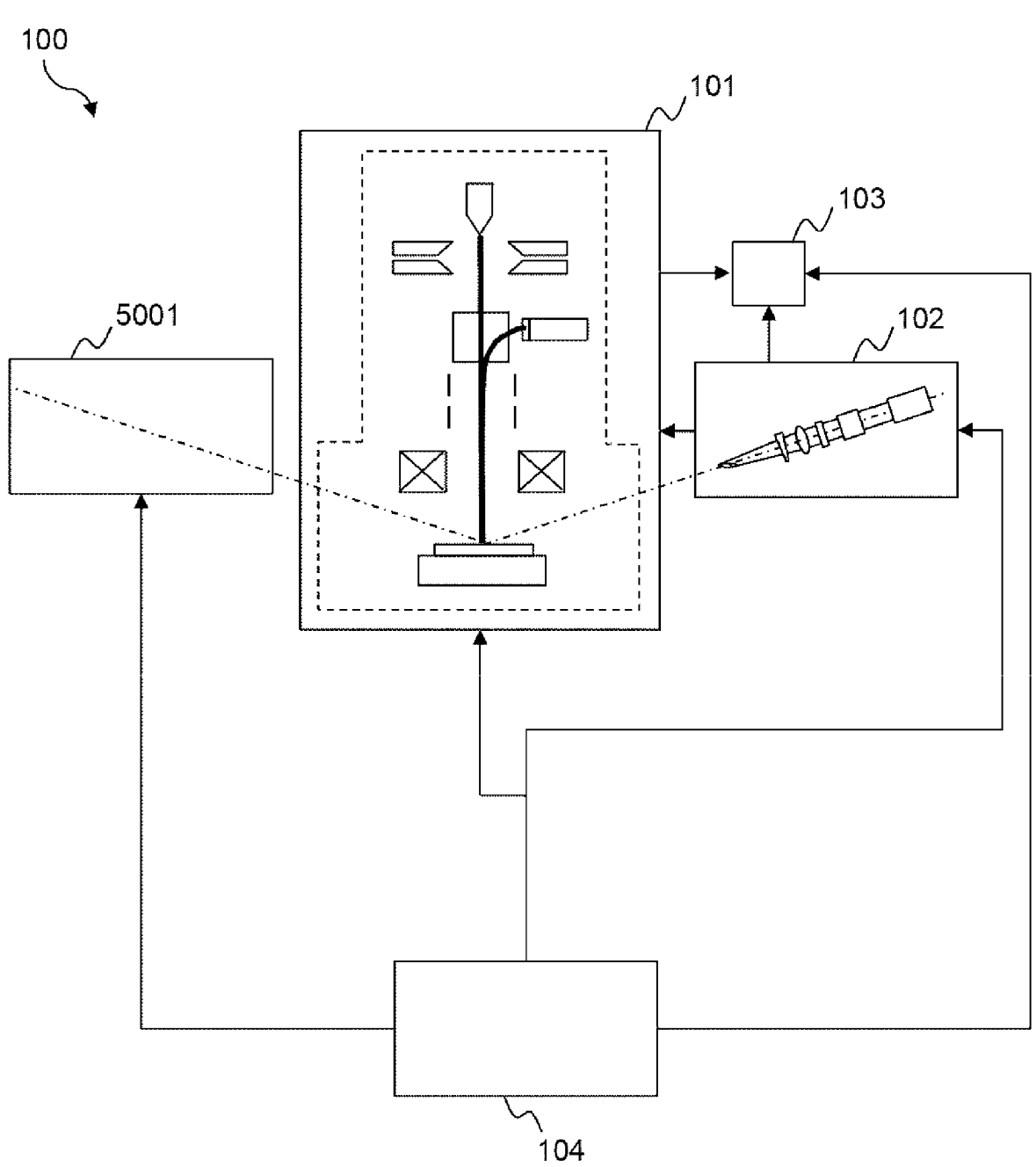
FIG. 27 is a diagram showing a configuration example of the charged particle beam system 100 according to Embodiment 6.

FIG. 27 is a diagram showing a configuration example of a charged particle beam system 100 according to Embodiment 6. The charged particle beam system illustrated in FIG. 27 includes the scanning electron microscope 101, the laser beam irradiation unit 102, the computer system 103, and the synchronization control system 104, as in FIG. 1, and includes a focused ion beam device 5001 to irradiate a sample with a focused ion beam. The surface of the sample can be processed by irradiating the sample with an ion beam using the focused ion beam device 5001. The focused ion beam device 5001 is composed of an ion source, an aperture, a focusing lens, an objective lens, a deflector, and an ion beam dose controller. The deflector is provided for one-dimensionally or two-dimensionally scanning the ion beam on the sample, and it is possible to control which position on the sample is processed by the deflector.

In Embodiment 6, the system of the scanning electron microscope 101 of FIG. 2, the system of the laser beam irradiation unit 102 of FIG. 20, the computer system 103 of FIG. 4, and the synchronization control system 104 of FIG. 5 were used.

Figure 28:
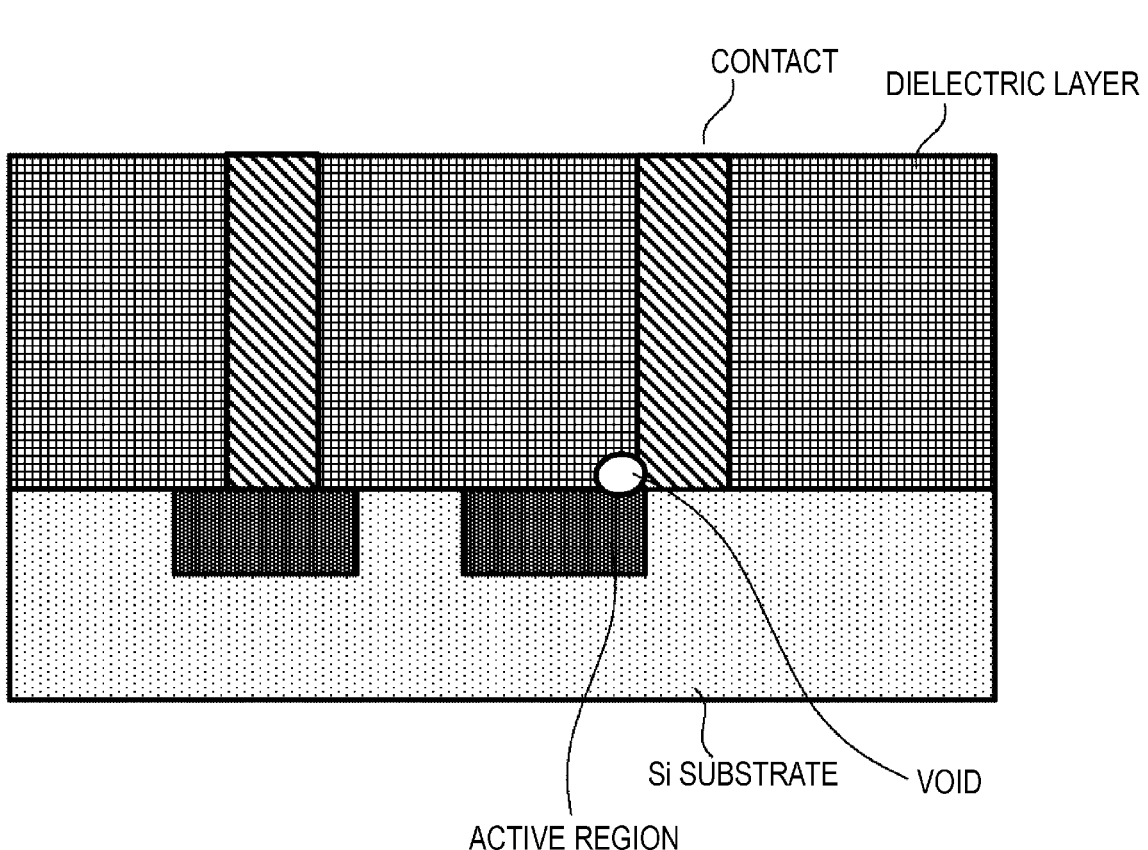
FIG. 28 is a diagram showing an example of a sample.

FIG. 28 is a diagram showing an example of a sample. The sample is a Magnetoresistive Random Access Memory (MRAM) structure in the middle of manufacturing, and contacts are exposed on the outermost surface. Voids occur where misalignment between the contacts and the active regions formed on the silicon substrate occurs.

Figure 29:
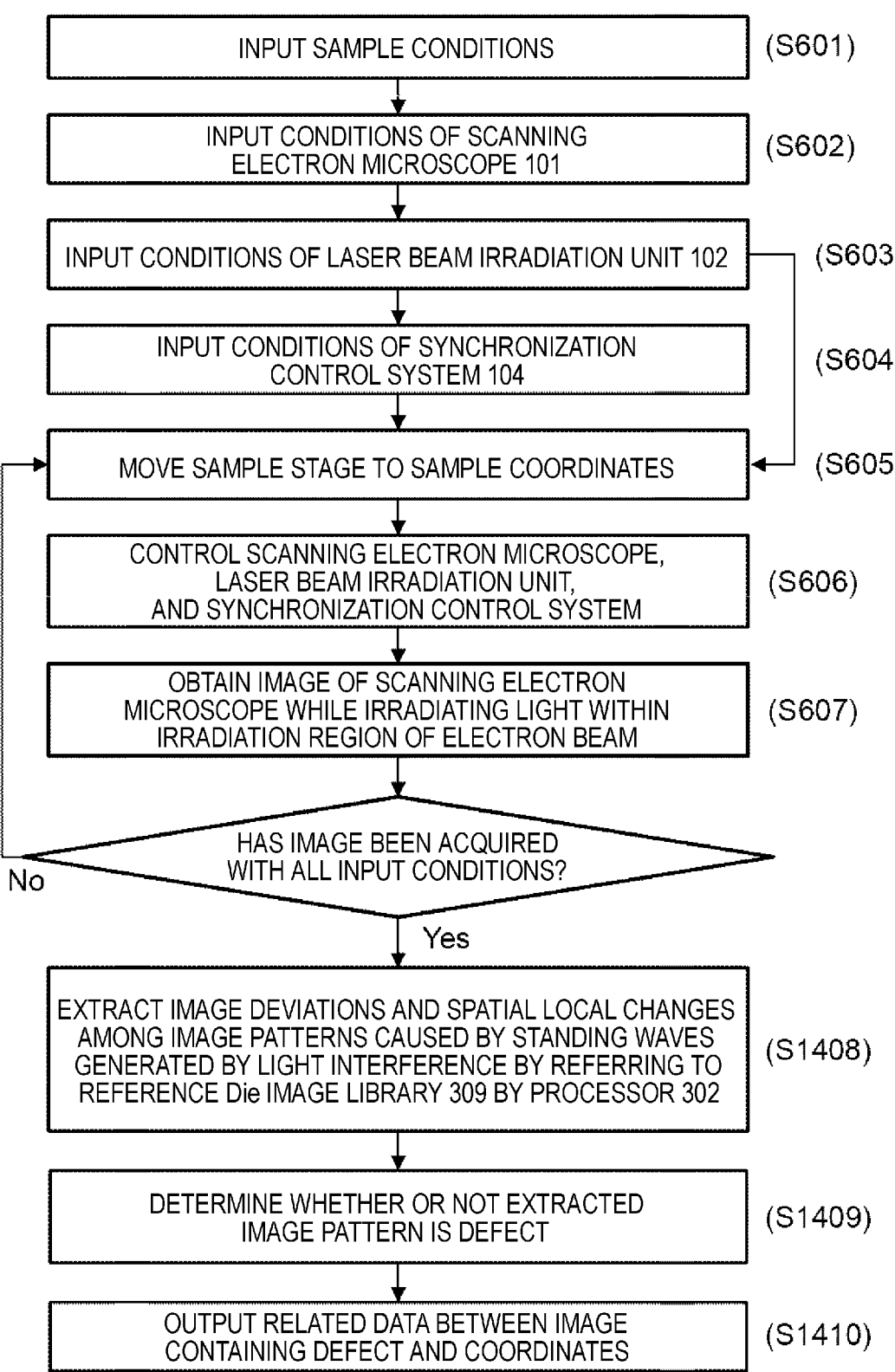
FIG. 29 is a flowchart showing a process of acquiring information on a sample by the charged particle beam system 100.

FIG. 29 is a flowchart showing a process of acquiring information on a sample by the charged particle beam system 100. The difference from FIG. 6 is that the processor 302 refers to the reference die image library 309 and extracts image deviations and spatial local changes from among image patterns caused by standing waves generated by light interference (S1408), determines whether or not the pattern of the extracted image is a defect (S1409), and outputs related data between the image containing the defect and the coordinates (S1410).

In S1408, the processor 302 referred to a database that stored the image patterns caused by standing waves generated by light interference, which occur in images when the contact is aligned with the active (normal case), to extract image deviations and spatial local changes.

In step S1409, the determination of whether or not the pattern of the extracted image is a defect is performed by the processor 302 using the k-nearest neighbors method to determine whether the pattern of the image was normal or defective based on a database containing both the image when the contact and the active are aligned (normal case) and the image when the contact and the active are not aligned (defective case). In this embodiment, as an image of a defect, only an image in which a void is generated in a portion out of alignment with the active is used. However, if processor 302 performs arithmetic processing using a database that also contains images of other defect types, for example, images of crystal defects, it is possible to classify the type of defect as well as to determine whether it is a defect or not. In addition, the image database is classified according to the depth, location, and size of the locations where the contacts are not aligned with the active, and the processor 302 determines the depth when the image pattern is defective, thereby the depth of the defect, the position of the defect, or the size of the defect can be also classified.

Figures 30, 31:
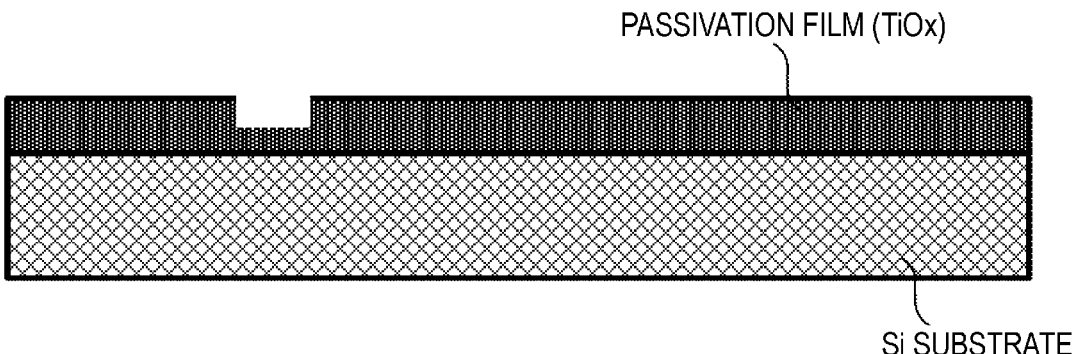
FIG. 30 is a diagram showing an example of a flowchart showing a process of destructively inspecting a sample based on information on the degree of defect depth.
FIG. 31 is a diagram showing an example of a sample.

FIG. 30 is a diagram showing an example of a flowchart showing a process of destructively inspecting a sample based on information on the degree of defect depth. First, information on the depth of the defect, the position of the defect, and the size of the defect obtained based on the flowchart of FIG. 29 is input to the focused ion beam device 5001 (S5101). Next, the sample is processed with a focused ion beam based on information on the depth of the defect, the position of the defect, and the size of the defect (S5102). Specifically, the ion beam dose is set based on the depth of the defect, the center point of the region where the ion beam is deflected is set based on the position of the defect, the size of the region where the ion beam is deflected is set based on the size of the defect. In embodiment 6, the flowcharts of FIGS. 6 and 30 are executed separately, but if a series of flowcharts combining the flowcharts of FIGS. 6 and 30 are executed, it is possible to acquire the conditions for destructive inspection of the sample from the pattern of images caused by standing waves generated by light interference, and execute the destructive inspection.

Embodiment 7

The charged particle beam system 100 according to Embodiment 7 of the present disclosure obtains information on the diffusion rate or mobility of the sample from the image pattern caused by standing waves generated by interference with the laser beam, which is obtained by changing the delay time between the electron beam irradiated on the sample and the laser beam.

In Embodiment 7, the system of the charged particle beam system of FIG. 1, the system of the scanning electron microscope 101 of FIG. 2, the system of the laser beam irradiation unit 102 of FIG. 20, the computer system 103 of FIG. 4, and the synchronization control system 104 of FIG. 5 were used.

FIG. 31 is a diagram showing an example of a sample. The sample is a structure in the middle of manufacturing a crystalline silicon solar cell, and has a structure in which a passivation film is formed on amorphous silicon. Although the passivation film is titanium oxide, there are portions where the film thickness of titanium oxide is locally thin.

Figure 32:
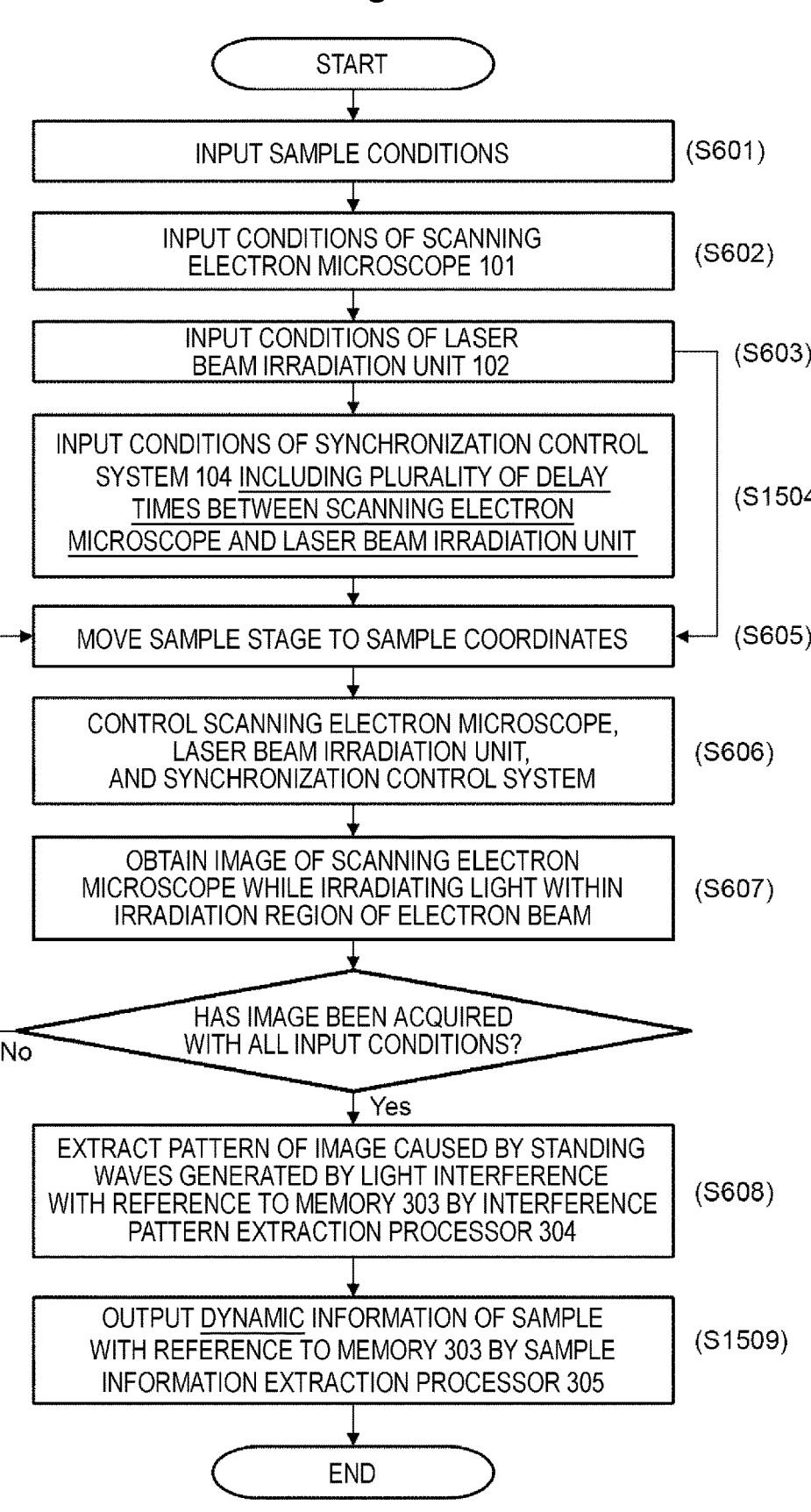
FIG. 32 is a flowchart showing a process of acquiring information on a sample by the charged particle beam system 100.

FIG. 32 is a flowchart showing a process of acquiring information on a sample by the charged particle beam system 100. The difference from FIG. 6 is that when the conditions for the synchronization control system 104 are input, the conditions including a plurality of delay times between the scanning electron microscope 101 and the laser beam irradiation unit 102 are input (S1504); and when the sample information extraction processor 305 outputs the information of the sample with reference to the memory 303, the sample information extraction processor 305 outputs the dynamic information of the sample (S1509).

The delay time between the scanning electron microscope 101 and the laser beam irradiation unit 102 is equivalent to the delay time between the electron beam and the laser beam irradiated to the sample; the delay time is positive when the electron beam is irradiated late relative to the laser beam and negative when the electron beam is irradiated early relative to the laser beam. In the present embodiment, the sample information extraction processor 305 accepts the temporal change in the position of the image pattern caused by standing waves generated by the interference of the laser beam, and thus the position dependence of the diffusion rate of the carriers moving in the passivation film is output and displayed as a bitmap of the image.

Figure 33:
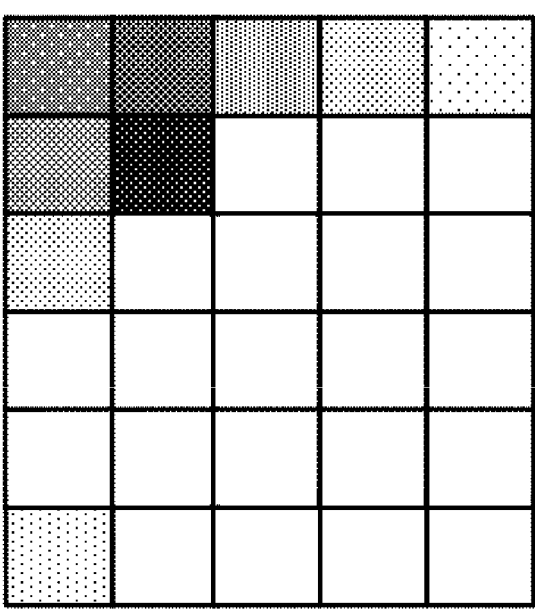
FIG. 33 is a diagram showing an example of results of position dependence of carrier diffusion rate.

FIG. 33 is a diagram showing an example of results of position dependence of carrier diffusion rate. It can be seen that there is a portion where the diffusion speed is high at the second pixel from the left and the second pixel from the top. Since there is a negative correlation between the diffusion rate and the film thickness of titanium oxide, by using this result, it is possible to extract locations where the film thickness of titanium oxide is thin and the performance as a passivation film is defective.

Figure 34:
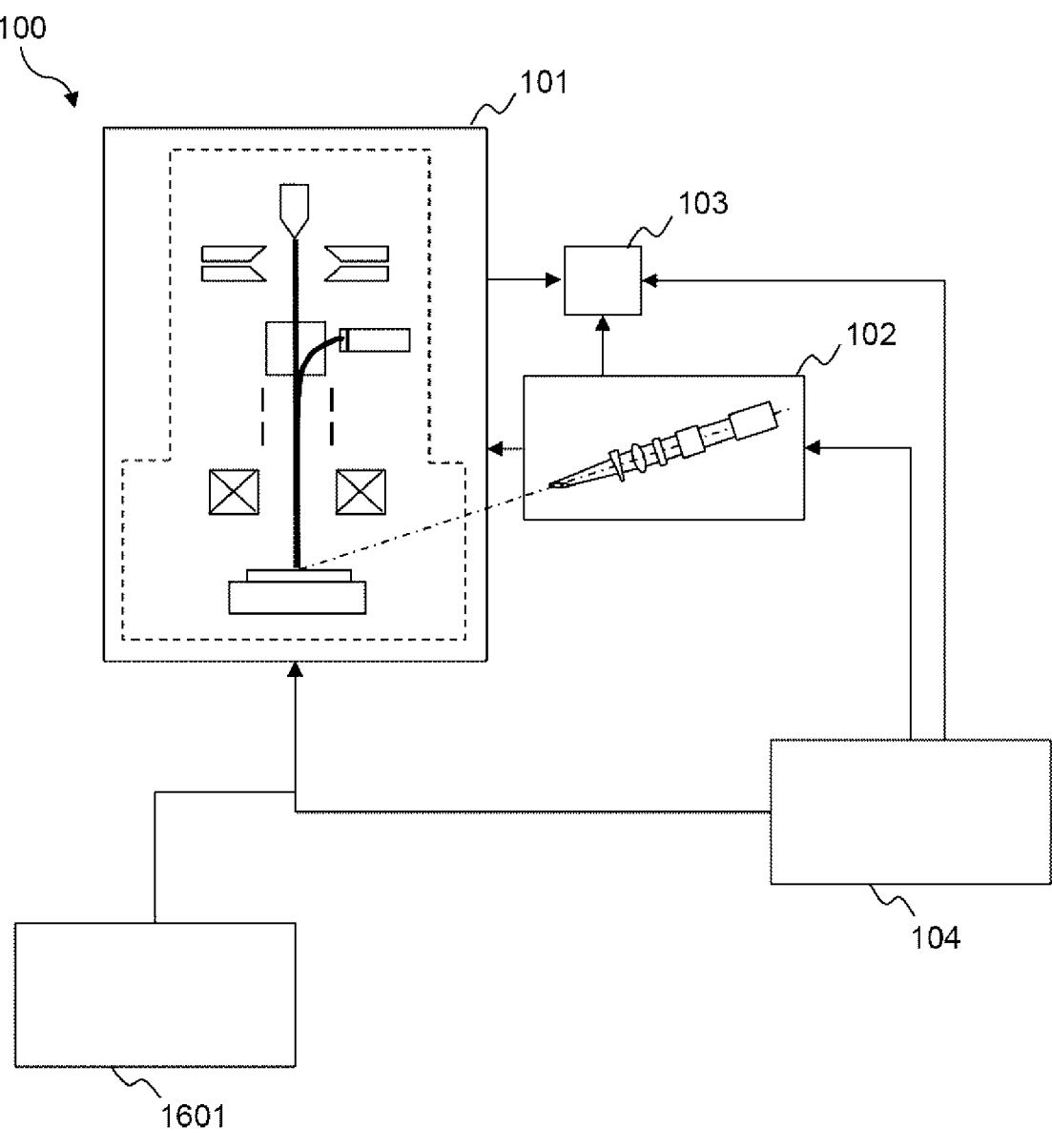
FIG. 34 is a diagram showing another configuration example of the charged particle beam system 100 according to Embodiment 7.

FIG. 34 is a diagram showing another configuration example of the charged particle beam system 100 according to Embodiment 7. The charged particle beam system 100 illustrated in FIG. 34 includes a scanning electron microscope 101, a laser beam irradiation unit 102, a computer system 103, a synchronization control system 104, and a sample electric field application unit 1601, as in FIG. 1. The sample electric field application unit 1601 is composed of a power source for applying an electric field to the sample and a probe. In Embodiment 7, two probes are used, one probe is in contact with the source of the sample in FIG. 11 and the other probe is in contact with the drain of the sample in FIG. 11, and a voltage is applied between the two probes to apply an electric field to the sample. By executing the flowchart of FIG. 32 in this state, the mobility could be output as the dynamic information of the sample.

Embodiment 8

In the charged particle beam system 100 according to Embodiment 8 of the present disclosure, the irradiation conditions of the electron beam and laser beam irradiated to the sample (delay time between the electron beam and the laser beam, their respective intensities, their respective wavelengths, the polarization of the laser beam, and their respective incident angles) are controlled to switch whether or not interference of the laser beam superimposed on the pattern of the image occurs.

In Embodiment 8, the system of the charged particle beam system of FIG. 1, the system of the scanning electron microscope 101 of FIG. 2, the system of the laser beam irradiation unit 102 of FIG. 20, the computer system 103 of FIG. 4, the synchronization control system 104 of FIG. 5, and the sample of FIG. 31 were used.

Figure 35:
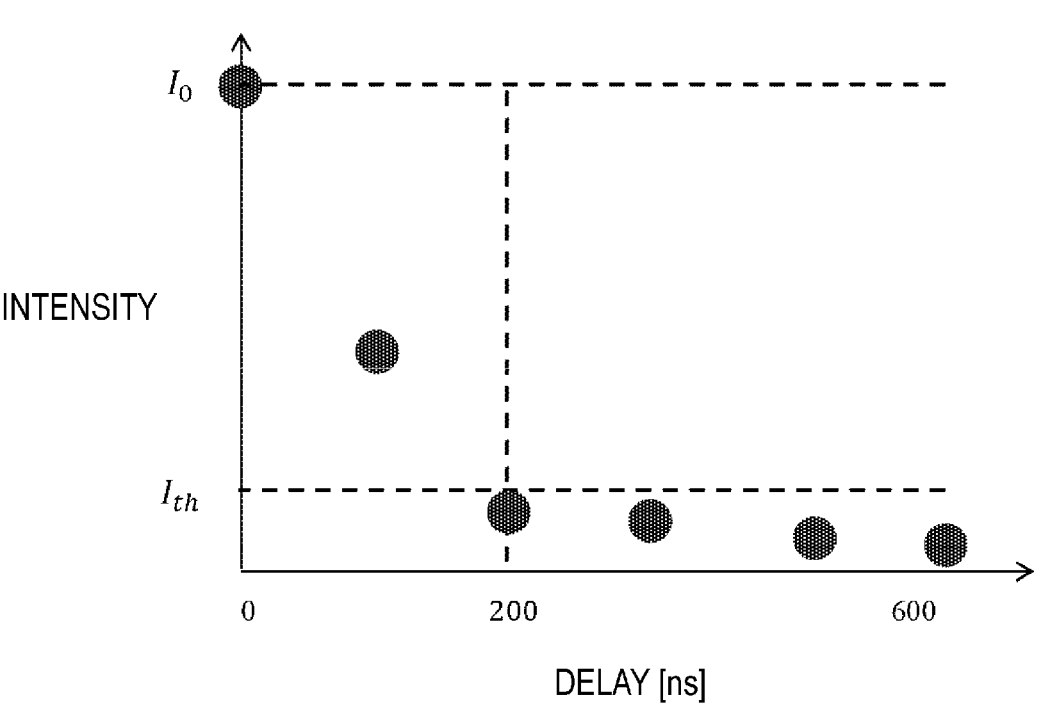
FIG. 35 is an example of data illustrating the relationship between the delay time between the scanning electron microscope 101 and the laser beam irradiation unit 102, and the intensity of the image pattern caused by standing waves generated by light interference.

FIG. 35 is an example of data illustrating the relationship between the delay time between the scanning electron microscope 101 and the laser beam irradiation unit 102, and the intensity of the image pattern caused by standing waves generated by light interference. The intensity of the image pattern is maximum at $I_0$ when the delay time is 0 ns. As the delay time increases, the intensity of the image pattern decreases, and at a delay time of 200 ns or longer, the intensity is below a threshold intensity ($I_{th}$) at which the image pattern can be identified. Based on this result, in Embodiment 8, the delay time is set to less than 200 ns when the interference of the laser beam is superimposed on the image, and the delay time is set to 200 ns or more when the laser beam interference is not superimposed on the image.

FIG. 36 is a flowchart showing a process of switching whether or not the charged particle beam system 100 superimposes interference of laser beam on an image. The difference from FIG. 6 is that whether or not to superimpose the interference of the laser beam on the image is set (S1700); that a plurality of delay times between the scanning electron microscope and the laser beam irradiation unit are input when the conditions of the synchronization control system 104 are input (S1504); that the interference pattern extraction processor 304 determines the presence or absence of the image pattern caused by standing waves generated by light interference with reference to the memory 303 (S1708); that based on S1700, the processor 302 switches between displaying an image acquired with a delay time set to superimpose laser beam interference on the image, and displaying an image acquired with a delay time set not to superimpose laser beam interference on the image (S1709).

By using the charged particle beam system 100 of Embodiment 8, it is possible to switch whether or not interference of laser beam superimposed on an image pattern occurs. In FIGS. 35 and 36, it was described that whether or not to generate an interference pattern is switched by controlling the delay time, but by combining one or more other parameters described in the introduction part of Embodiment 8, similarly, it is also possible to switch whether or not to generate an interference pattern.

Embodiment 9

The charged particle beam system 100 of Embodiment 9 of the present disclosure obtains, from a pattern of images resulting from standing waves generated by interference between a laser beam incident on a sample and a laser beam reflected from the sample reflected by a mirror, information on the amount of deviation between the center of gravity of the pattern on the upper layer and the center of gravity of the pattern on the lower layer of the sample is obtained.

In Embodiment 9, the system of the charged particle beam system of FIG. 1, the system of the scanning electron microscope 101 of FIG. 2, the system of the laser beam irradiation unit 102 of FIG. 20, the computer system 103 of FIG. 4, and the synchronization control system 104 of FIG. 5 were used.

Figure 37:
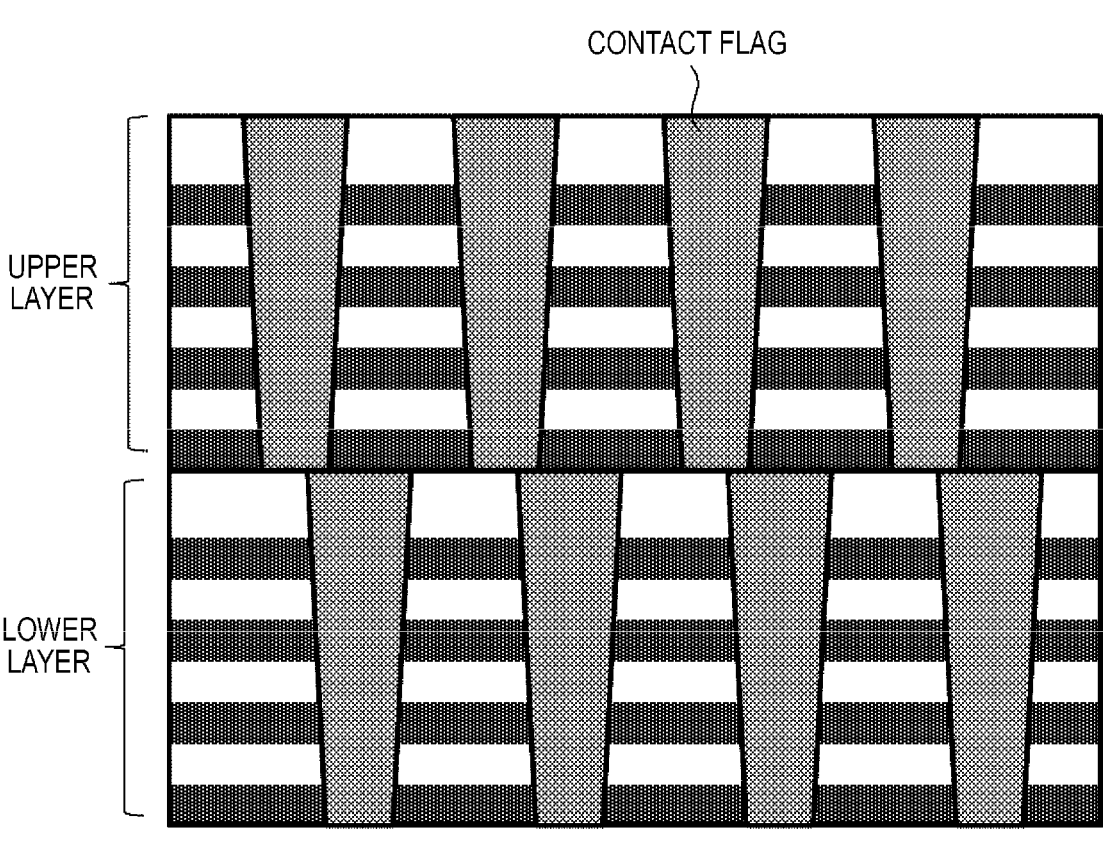
FIG. 37 is a diagram showing an example of a sample.

FIG. 37 is a diagram showing an example of a sample. The sample has a structure in which the contact plug of the upper layer memory hole unit is exposed on the surface in the manufacturing process of forming the upper layer memory hole unit on the lower layer memory hole unit during the manufacture of the 3D-NAND flash memory. Since the upper layer memory hole unit and the lower layer memory hole unit are manufactured separately, the center of gravity of the upper layer contact plug and the center of gravity of the lower layer contact plug may deviate.

FIG. 38 is a flowchart showing a process of acquiring information on a sample by the charged particle beam system 100. The difference from FIG. 6 is that when the sample conditions are input, the design data of the sample material and dimensions stored in the design data library 310 or the like are also input (S1801), and when the sample information extraction processor 305 outputs the deviation amount of the center of gravity, which is the information of the sample, with reference to the memory 303, the intensity and density of the pattern of the extracted image and the positional differential amount of the intensity are also referred to (S1809).

FIG. 39 is an example of data illustrating the relationship between the amount of deviation of the center of gravity and the intensity of an extracted image pattern, and the relationship between the amount of deviation of the center of gravity and the amount of positional differential of the intensity of the extracted image pattern. The intensity of the pattern of the image takes a minimum value when the deviation amount of the center of gravity is minimal, and the intensity of the pattern of the image increases as the deviation amount increases. When the center of gravity shifts positively, the positional differential amount of the intensity of the image pattern becomes positive, and when the center of gravity shifts negatively, the positional differential amount of the intensity of the image pattern becomes negative.

In Embodiment 9, the data in FIG. 39 are fitted with a regression equation of a sixth-order polynomial. When the sample information extraction processor 305 outputs the amount of deviation, first, the sign of the positional differential amount of the intensity of the image pattern is used to determine whether the deviation amount of the center of gravity is positive or negative, and then the intensity of the image pattern, the result of determination about whether the deviation amount of the center of gravity was positive or negative, and the regression equation were used to calculate the deviation amount of the center of gravity.

<Regarding Modifications of the Present Disclosure>

The present disclosure is not limited to the above-described embodiments, and includes various modifications. For example, the embodiments described above are those described in detail to describe the present disclosure in an easy-to-understand manner, not necessarily limited to those having all the configurations described. Further, it is possible to replace a part of the configuration of one embodiment with the configuration of another embodiment, and it is also possible to add the configuration of the other embodiment to the configuration of one embodiment. Further, it is possible to add, delete, or replace another configuration for a part of the configuration of each embodiment.

In Embodiment 1, the pulsed electron generator 4 is separately provided in addition to the electron beam source 1, but it is also possible to use an electron beam source capable of irradiating pulsed electrons. In addition, in Embodiment 1, the pulsed electron generator 4 is a deflector that blocks irradiation of the beam to the sample, and the pulsed beam is generated by intermittently blocking the beam using the deflector. It is also possible to generate a pulsed beam by changing the position of the diaphragm at high speed.

In Embodiment 1, the scanning electron microscope 101 provided with an electron beam source and a deflector is used, but other charged particle microscopes such as a scanning ion microscope provided with an ion source and a deflector can also be used, and it is also possible to use a transmission electron microscope that detects an electron beam that passes through a sample without providing a deflector.

Figure 40:
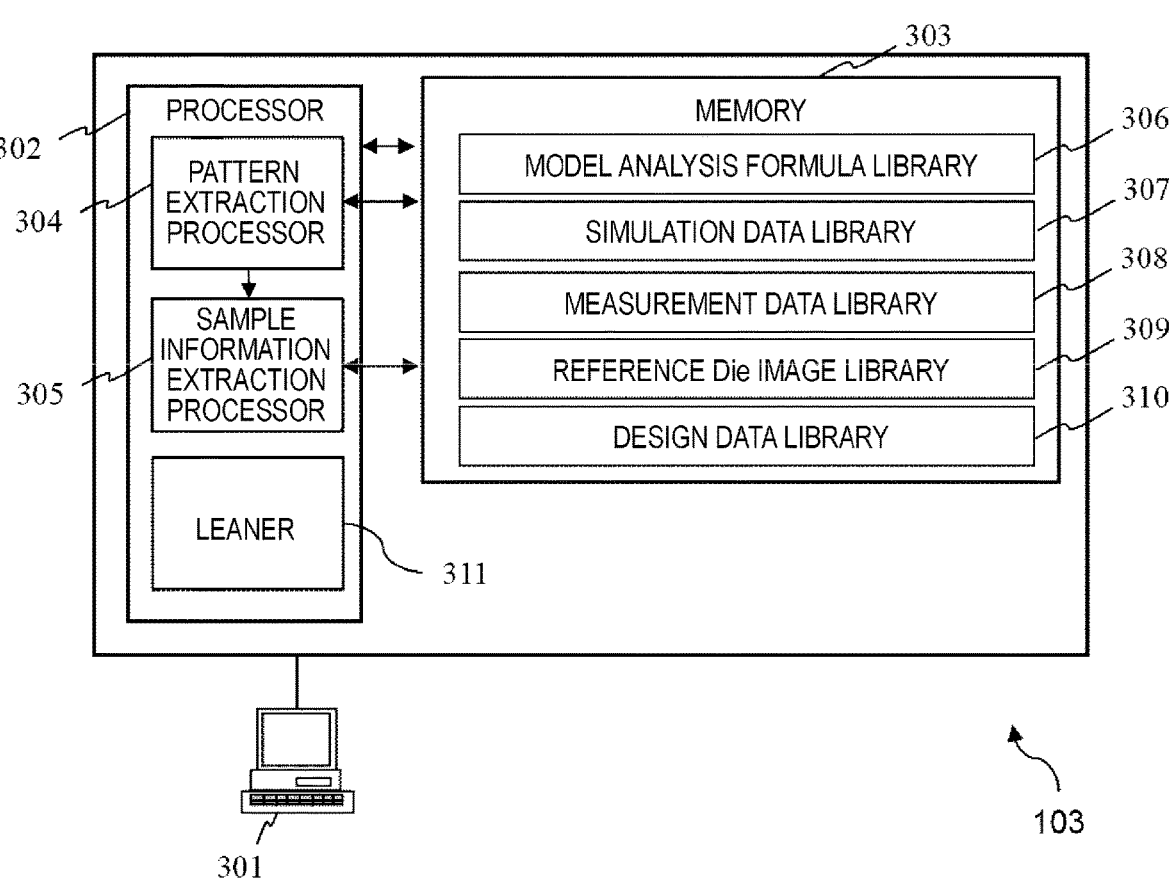
FIG. 40 is a configuration diagram of a modification of the computer system 103.

FIG. 40 is a diagram showing a configuration diagram of a modification of the computer system 103. Each data library stored in the memory 303 is data describing the relationship between the feature amount and the parameters used to derive it, so these data libraries can be configured as training result data in machine learning. In this case, the processor 302 can implement a learner 311 that acquires feature amounts using the training result data. The learner 311 receives input parameters corresponding to the relationships described in the data library as input values, and uses the relationships according to the training result data to obtain output values, thereby obtaining feature amounts. The learner 311 can be constructed by the processor 302 executing software implementing a machine learning algorithm such as a neural network.

REFERENCE SIGNS LIST

100: Charged particle beam system
101: Scanning electron microscope
102: Laser beam irradiation unit
103: Computer system
104: Synchronization control system

The invention claimed is:

1. A charged particle beam system that generates an observed image of a sample by irradiating the sample with a charged particle beam, the system comprising:
    a charged particle source that irradiates the sample with the charged particle beam;
    a first light irradiation unit that irradiates the sample with a first light;
    a detector that detects secondary charged particles generated by irradiating the sample with the charged particle beam and outputs a detection signal representing the intensity of the secondary charged particles; and
    a computer system that generates the observed image using the detection signal, wherein
    the computer system extracts from the observed image a first feature amount resulting from interference of the first light, diffraction of the first light, or standing waves of the first light caused by irradiating the sample with the first light, and
    the computer system acquires a second feature amount of the sample using the first feature amount.

2. The charged particle beam system according to claim 1, characterized in that:
    the computer system includes a storage unit that stores a data library describing parameters that serve as criteria for determining whether an image pattern that the observed image has is caused by interference of the first light, diffraction of the first light, or standing waves of the first light as the first feature amount,
    the computer system identifies, from among the image patterns, those for which a degree of matching between the parameters possessed by the image patterns and the parameters described by the data library is equal to or greater than a threshold, and the computer system acquires the second feature amount using the first feature amount of the identified image pattern.

3. The charged particle beam system according to claim 1, characterized in that:

the computer system includes a storage unit that stores a data library that describes the second feature amount using a function represented by the first feature amount, and the computer system acquires the second feature amount using the function by referring to the data library using the first feature amount.

4. The charged particle beam system according to claim 1, characterized in that:

the computer system acquires, as the first feature amount, an interval of interference fringe patterns caused by interference of the first light, diffraction of the first light, or standing waves of the first light on the observed image, the computer system identifies, among image patterns possessed by the observed image, those in which a degree of matching between the interval of the interference fringe pattern possessed by the image pattern and the acquired interval is equal to or greater than a threshold, and the computer system acquires the second feature amount using the interval between the interference fringe patterns possessed by the identified image pattern as the first feature amount.

5. The charged particle beam system according to claim 4, characterized in that:

the computer system acquires, as the first feature amount, at least any one of an interval of the interference fringe pattern possessed by the identified image pattern, and a position of the interference fringe pattern possessed by the identified image pattern, and the computer system calculates at least one of a height of the pattern that the sample has or an inclination angle of a sidewall of the pattern that the sample has as the second feature amount using a function represented by the first feature amount and an incident angle of the first light.

6. The charged particle beam system according to claim 1, characterized in that:

the charged particle beam system further comprises a second light irradiation unit that irradiates the sample with a second light, the computer system obtains, as the first feature amount, a power spectrum of an interference pattern generated by interference between the first light and the second light on the observed image, the computer system identifies, from among the image patterns possessed by the observed image, those for which a degree of matching between the power spectrum of the interference pattern possessed by the image pattern and the acquired power spectrum is equal to or greater than a threshold, and the computer system acquires the second feature amount using the power spectrum of the interference pattern possessed by the identified image pattern as the first feature amount.

7. The charged particle beam system according to claim 6, characterized in that:

the computer system calculates at least one of a dielectric constant of the sample and a magnetic permeability of the sample as the second feature amount, using a function represented by an incident angle of the first light or the second light with respect to the sample and a refraction angle when the first light or the second light passes through the sample, and a function represented by a wavelength of the first light or the second light.

8. The charged particle beam system according to claim 7, characterized in that:

the computer system calculates a dielectric relaxation frequency of the sample as the second feature amount, using a function represented by a frequency of the charged particle beam and the dielectric constant of the sample when space electric hyperpolarization occurs, or a function represented by a frequency of the first light or the second light and the dielectric constant of the sample when electronic polarization occurs.

9. The charged particle beam system according to claim 1, characterized in that:

the computer system calculates at least one of a light absorption coefficient of the sample and an inclination angle of a sidewall of a pattern of the sample as the second feature amount, using a function represented by the incident angle of the first light, the wavelength of the first light, the dielectric constant of the sample, the magnetic permeability of the sample, and the polarization angle of the first light, and the computer system uses the calculated inclination angle of the sidewall to calculate the shape of the sidewall.

10. The charged particle beam system according to claim 9, characterized in that:

the computer system includes a storage unit for storing a data library describing the calculated shape of the sidewall, and the computer system estimates the shape of the sidewall by referring to the data library using at least one of the incident angle of the first light, the wavelength of the first light, the dielectric constant of the sample, the magnetic permeability of the sample, and the polarization angle of the first light.

11. The charged particle beam system according to claim 4, characterized in that:

the charged particle beam system further comprises a reflecting mirror that re-reflects the first light reflected from the sample back to the sample as reflected light, the computer system acquires a phase difference of the standing wave between pixels of the observed image as the first feature amount.

12. The charged particle beam system according to claim 11, characterized in that:

the computer system calculates a parameter representing a surface roughness of the sample as the second feature amount using the acquired phase difference.

13. The charged particle beam system according to claim 1, characterized in that:

the computer system implements a learner that learns by machine learning a relationship between at least one of the first feature amount and the second feature amount and an operating parameter suitable as an operating condition of the charged particle beam system, and the computer system controls the operation of the charged particle beam system using the operation parameter output by the learner.

14. The charged particle beam system according to claim 1, characterized in that:

the computer system includes a storage unit that stores a data library that describes a relationship between a local deviation of the first feature amount and the second feature amount, the data library describes at least one of a depth of a defect of the sample, a planar position of the defect, and a size of the defect as the second feature amount, and the computer system obtains a local change in the first feature amount, and refers to the data library using the obtained local deviation to obtain at least one of the depth of the defect possessed by the sample, a planar position of the defect, and a size of the defect.

15. The charged particle beam system according to claim 14, characterized in that:

the data library holds an image pattern of the observed image of the sample having the defect and an image pattern of the observed image of the sample having no defect, and the computer system determines whether the sample has the defect by comparing an observed image of the sample acquired using the detection signal with an observed image stored in the data library.

16. The charged particle beam system according to claim 1, characterized in that:

the computer system acquires change over time of the first feature amount, and the computer system acquires a diffusion speed or mobility of carriers on the sample as the second feature amount using a time rate of the change over time.

17. The charged particle beam system according to claim 1, characterized in that:

at least one of the charged particle source and the first light irradiation unit changes at least one of a time difference between the charged particle beam and the first light, intensity of at least one of the charged particle beam and the first light, wavelength of at least one of the charged particle beam and the first light, polarization of the first light, and an incident angle of at least one of the charged particle beam and the first light, to switch whether to generate the first feature amount on the observed image.

18. The charged particle beam system according to claim 1, characterized in that:

the charged particle beam system further comprises a reflecting mirror that re-reflects the first light reflected from the sample back to the sample as reflected light, and the computer system acquires at least one of a pixel value of the observed image and a differential value obtained by differentiating the pixel value with respect to a position on the observed image as the first feature amount.

19. The charged particle beam system according to claim 18, characterized in that:

the computer system acquires, as the second feature amount, a positional deviation amount between an upper layer pattern and a lower layer pattern formed on the sample using at least one of the pixel value and the differential value.

* * * * *